United States Patent
Paris et al.

(10) Patent No.: US 11,344,973 B2
(45) Date of Patent: May 31, 2022

(54) METHODS FOR FORMING HOLES IN SUBSTRATES

(71) Applicant: Corning Incorporated, Corning, NY (US)

(72) Inventors: Bertrand Paris, Corning, NY (US); Garrett Andrew Piech, Corning, NY (US); Kristopher Allen Wieland, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 5 days.

(21) Appl. No.: 16/377,947

(22) Filed: Apr. 8, 2019

(65) Prior Publication Data

US 2019/0321921 A1     Oct. 24, 2019

Related U.S. Application Data

(60) Provisional application No. 62/659,905, filed on Apr. 19, 2018.

(51) Int. Cl.
*C03C 23/00* (2006.01)
*B23K 26/382* (2014.01)
(Continued)

(52) U.S. Cl.
CPC ........ *B23K 26/382* (2015.10); *B23K 26/0006* (2013.01); *B23K 26/16* (2013.01);
(Continued)

(58) Field of Classification Search
CPC ...... B23K 26/382; B23K 26/16; B23K 26/53; B23K 26/009; B23K 26/0624;
(Continued)

(56) References Cited

U.S. PATENT DOCUMENTS

| | | | |
|---|---|---|---|
| 9,517,963 B2 | 12/2016 | Marjanovic et al. | |
| 2002/0158052 A1* | 10/2002 | Ehrmann | B23K 26/043 219/121.69 |

(Continued)

FOREIGN PATENT DOCUMENTS

| | | | |
|---|---|---|---|
| DE | 102011113824 A1 | 3/2013 | |
| DE | 102013005135 A1 * | 10/2014 | B23K 26/36 |

(Continued)

OTHER PUBLICATIONS

Wikipedia, "Rayleigh length" via http://web.archive.org/web/20170721185348/https://en.wikipedia.org/wiki/Rayleigh_length; pp. 1-2 (Year: 2017).*

(Continued)

*Primary Examiner* — Binh X Tran
(74) *Attorney, Agent, or Firm* — Amy T. Lang; John P. McGroarty

(57) ABSTRACT

Methods for forming holes in a substrate by reducing back reflections of a quasi-non-diffracting beam into the substrate are described herein. In some embodiments, a method of processing a substrate having a first surface and a second surface includes applying an exit material to the second surface of the substrate, wherein a difference between a refractive index of the exit material and a refractive index of the substrate is 0.4 or less, and focusing a pulsed laser beam into a quasi-non-diffracting beam directed into the substrate such that the quasi-non-diffracting beam enters the substrate through the first surface. The substrate is transparent to at least one wavelength of the pulsed laser beam. The quasi-non-diffracting beam generates an induced absorption within the substrate that produces a damage track within the substrate.

22 Claims, 15 Drawing Sheets

(51) Int. Cl.
  *C03C 15/00* (2006.01)
  *C04B 41/00* (2006.01)
  *C04B 41/53* (2006.01)
  *B23K 26/00* (2014.01)
  *B23K 26/16* (2006.01)
  *B23K 26/53* (2014.01)
  *C04B 41/45* (2006.01)
  *B23K 103/16* (2006.01)
  *B23K 101/42* (2006.01)

(52) U.S. Cl.
  CPC .............. *B23K 26/53* (2015.10); *C03C 15/00* (2013.01); *C03C 23/0025* (2013.01); *C04B 41/0036* (2013.01); *C04B 41/4572* (2013.01); *C04B 41/5353* (2013.01); *B23K 2101/42* (2018.08); *B23K 2103/166* (2018.08)

(58) Field of Classification Search
  CPC ... B23K 26/364; C03C 15/00; C03C 23/0025; C04B 41/0036; C04B 41/5353
  USPC .......................................................... 216/65
  See application file for complete search history.

(56) References Cited

U.S. PATENT DOCUMENTS

| | | |
|---|---|---|
| 2011/0129634 A1 | 6/2011 | Usami |
| 2013/0183833 A1* | 7/2013 | Duan ................ B23K 26/0643 438/778 |
| 2015/0165563 A1 | 6/2015 | Manley et al. |
| 2016/0008927 A1* | 1/2016 | Grundmueller ........ B23K 26/57 65/112 |
| 2017/0008122 A1 | 1/2017 | Wieland et al. |
| 2017/0189991 A1* | 7/2017 | Gollier .................. G02B 5/001 |
| 2018/0062342 A1 | 3/2018 | Comstock, II et al. |
| 2018/0068868 A1 | 3/2018 | Jaramillo et al. |
| 2018/0093914 A1 | 4/2018 | Akarapu et al. |

FOREIGN PATENT DOCUMENTS

| | | |
|---|---|---|
| DE | 102013005135 A1 | 10/2014 |
| NL | 2017998 | 6/2018 |

OTHER PUBLICATIONS

Wikipedia, "List of refractive indices" via https://en.wikipedia.org/wiki/List_of_refractive_indices ; pp. 1-7 (Year: 2021).*
Wikipedia, "Oil immersion" via https://en.wikipedia.org/wiki/Oil_immersion ; pp. 1-4 (Year: 2021).*
Wikipedia, "Soda-lime glass" via https://en.wikipedia.org/wiki/Soda%E2%80%93lime_glass ; pp. 1-5 (Year: 2020).*
Merrrian Webster defintion of "match" via https://www.merriam-webster.com/dictionary/match ; pp. 1-13 (Year: 2021).*
International Searching Authority Invitation To Pay Additional Fees; PCT/US2019/027490 dated Jul. 19, 2019; 15 Pgs.

* cited by examiner

METHODS FOR FORMING HOLES IN SUBSTRATES

This application claims the benefit of priority to U.S. Provisional Application Ser. No. 62/659,905 filed on Apr. 19, 2018, the content of which is relied upon and incorporated herein by reference in its entirety.

BACKGROUND

Field

The present disclosure generally relates to methods for forming holes in a substrate and, more particularly, methods for forming holes in a substrate using laser-damage-and-etch processes.

Technical Background

Substrates have been used as an interposer disposed between electrical components (e.g., printed circuit boards, integrated circuits, and the like). Such substrates have holes that may be filled by an electroplating process wherein electrically conductive material (e.g., copper) is deposited on the sidewalls of the hole and continuously built up until the hole is hermetically sealed. This process results in metallized through-substrate vias that provide a path through the interposer for electrical signals to pass between opposite sides of the interposer.

Small-diameter vias conducive to providing electrical connections through substrates may be formed by a laser-damage-and-etch process. In this process, a damage track is initially formed in the substrate by using a laser to modify the material along the damage track. An etching solution is then applied to the substrate. The substrate is thinned by the etching solution. Because the etching rate of the material is faster at the damage track than at non-damaged regions, the damage track is preferentially etched so that a hole is opened through the substrate. Downstream processes, such as metallization processes, may require uniformly round holes (i.e., holes having low circularity) and relatively smooth interior surface.

SUMMARY

In a first embodiment, a method of processing a substrate having a first surface and a second surface includes applying an exit material to the second surface of the substrate, wherein a difference between a refractive index of the exit material and a refractive index of the substrate is 0.4 or less, and focusing a pulsed laser beam into a quasi-non-diffracting beam directed into the substrate such that the quasi-non-diffracting beam enters the substrate through the first surface. The substrate is transparent to at least one wavelength of the pulsed laser beam. The quasi-non-diffracting beam generates an induced absorption within the substrate that produces a damage track within the substrate.

In a second embodiment, the method of the first embodiment wherein the difference is 0.2 or less.

In a third embodiment, the method of the first or second embodiments, wherein the substrate is made from one of glass, glass-ceramic and ceramic.

In a fourth embodiment, the method of any preceding embodiment, wherein a location that the quasi-non-diffracting beam exits the exit material is 50 μm or more away from the second surface of the substrate in a direction parallel to the quasi-non-diffracting beam.

In a fifth embodiment, the method of any preceding embodiment, wherein the exit material is applied to the second surface such that there is a reflection of less than 2.5% at a predetermined region surrounding the damage track.

In a sixth embodiment, the method of any preceding embodiment, wherein a diameter of the predetermined region is 300 μm.

In a seventh embodiment, the method of any preceding embodiment, wherein the exit material includes at least two layers.

In an eighth embodiment, the method of any preceding embodiment, wherein the exit material is a polymer.

In a ninth embodiment, the method of any one of the first through seventh embodiments, wherein the exit material is an anti-reflective coating.

In a tenth embodiment, the method of any one of the first through seventh embodiments, wherein the exit material is water.

In an eleventh embodiment, the method of the tenth embodiment further including a supporting substrate attached to the substrate such that the water is disposed between the supporting substrate and the second surface of the substrate.

In a twelfth embodiment, the method of any one of the first through seventh embodiments, wherein the exit material is a silicone layer.

In a thirteenth embodiment, the method of the twelfth embodiment, further including a polyester substrate, wherein the silicone layer is disposed between the polyester substrate and the second surface of the substrate.

In a fourteenth embodiment, the method of any one of the first through seventh embodiments, wherein the exit material is a photoresist polymer material applied to the second surface of the substrate.

In a fifteenth embodiment, the method of any preceding embodiment, wherein the quasi-non-diffracting beam is a Gauss-Bessel beam.

In a sixteenth embodiment, the method any of the first through fourteenth embodiments, wherein the quasi-non-diffracting beam is an Airy beam.

In a seventeenth embodiment, the method of any preceding embodiment, wherein the quasi-non-diffracting beam has a beam waist, and the quasi-non-diffracting beam defines a laser beam focal line having a first end point and a second endpoint each defined by locations where the quasi-non-diffracting beam has propagated a distance from the beam waist equal to a Rayleigh range of the quasi-non-diffracting beam.

In an eighteenth embodiment, the method of any preceding embodiment, wherein the pulsed laser beam includes a burst further including a plurality of pulses.

In a nineteenth embodiment, the method of the eighteenth embodiment, wherein a pulse width of each pulse of the plurality of pulses is within a range of 100 fsec to 10 psec, including endpoints.

In a twentieth embodiment, the method of any preceding embodiment, further including etching the substrate in an etching solution to produce a hole having a diameter or 1 μm or more by enlarging the damage track in the substrate.

In a twenty-first embodiment, the method of the twentieth embodiment, further including coating interior surfaces of the hole with an electrically conductive material to provide electrical conductivity between a top and a bottom of the hole.

In a twenty-second embodiment, the method of the twentieth embodiment, wherein a difference between an average surface roughness of interior surfaces of the hole from a waist of the hole to the first surface and an average surface roughness of interior surfaces of the hole from the waist of the hole to the second surface 1 µm Ra or less.

In a twenty-third embodiment, the method of any one of the first through sixteenth embodiments and eighteenth through twenty-second embodiments, wherein the quasi-non-diffracting beam defines a laser beam focal line having a first endpoint and a second endpoint each defined by locations where the quasi-non-diffracting beam has propagated a distance from a beam waist equal to a Rayleigh range, the first endpoint is closer to the first surface of the substrate than the second surface, the second endpoint is closer to the second surface of the substrate than the first surface, and the second endpoint is outside of the substrate such that a distance between the second endpoint and the second surface is 100 µm or less.

In a twenty-fourth embodiment, the method of the twenty-third embodiment, wherein the second endpoint is outside of the substrate such that a distance between the second endpoint and the second surface is 10 µm or less.

In a twenty-fifth embodiment, a method of forming a hole in a substrate having a first surface and a second surface includes focusing a pulsed laser beam into a quasi-non-diffracting beam directed into the substrate such that the quasi-non-diffracting beam enters the substrate through the first surface. The quasi-non-diffracting beam generates an induced absorption within the substrate and produces a damage track within the substrate. The substrate is transparent to at least one wavelength of the pulsed laser beam. The quasi-non-diffracting beam defines a laser beam focal line having a first endpoint and a second endpoint each defined by locations where the quasi-non-diffracting beam has propagated a distance from the beam waist equal to a Rayleigh range. The first endpoint is closer to the first surface of the substrate than the second surface, and the second endpoint is closer to the second surface of the substrate than the first surface. The second endpoint is outside of the substrate such that a distance between the second endpoint and the second surface is 100 µm or less. The method further includes etching the substrate to produce the hole by enlarging the damage track in the substrate.

In a twenty-sixth embodiment, the method of the twenty-fifth embodiment, wherein the distance between the second endpoint and the second surface is 10 µm or less.

In a twenty-seventh embodiment, the method of the twenty-fifth or twenty-sixth embodiments, wherein a pulse width of the pulsed laser beam is within a range of 100 fsec to 10 psec, including endpoints.

In a twenty-eighth embodiment, an article includes a substrate having a first surface, a second surface, and at least one damage track extending within the substrate from the first surface to the second surface. The article further includes an exit material disposed on at least one of the first surface and the second surface, wherein an interface is defined between the exit material and the at least one of the first surface and the second surface, and a reflectivity of the interface is 2.5% or less at a wavelength within a range of 200 nm to 2000 nm, including endpoints.

In a twenty-ninth embodiment, the article of the twenty-eighth embodiment, wherein the reflectivity of the interface is 2.5% or less at a wavelength of 1064 nm±10 nm, 1030 nm±10 nm, and 530 nm±10 nm.

In a thirtieth embodiment, the article of the twenty-eighth embodiment or the twenty-ninth embodiment, wherein a difference between a refractive index of the exit material and a refractive index of the substrate is 0.4 or less.

In a thirty-first embodiment, the article of the thirtieth embodiment, wherein the difference is 0.2 or less.

In a thirty-second embodiment, the article of any one of the twenty-eighth through thirty-first embodiments, wherein the substrate is made from one of glass, glass-ceramic and ceramic.

In a thirty-third embodiment, the article of any one of the twenty-eighth through thirty-second embodiments, wherein the exit material includes at least two layers.

In a thirty-fourth embodiment, the article of any one of the twenty-eighth through thirty-second embodiments, wherein the exit material is a polymer.

In a thirty-fifth embodiment, the article of any one of the twenty-eighth through thirty-second embodiments, wherein the exit material is an anti-reflective coating.

In a thirty-sixth embodiment, the article of any one of the twenty-eighth through thirty-second embodiments, wherein the exit material is water.

In a thirty-seventh embodiment, the article of the thirty-sixth embodiment, further including a supporting substrate attached to the substrate such that the water is disposed between the supporting substrate and the second surface of the substrate.

In a thirty-eighth embodiment, the article of any one of the twenty-eighth through thirty-second embodiments, wherein the exit material is a silicone layer.

In a thirty-ninth embodiment, the article of the thirty-eighth embodiment, further including a polyester substrate, wherein the silicone layer is disposed between the polyester substrate and the second surface of the substrate.

In a fortieth embodiment, the article of any one of the twenty-eighth through thirty-second embodiments, wherein the exit material is a photoresist polymer material applied to the second surface of the substrate.

Additional features and advantages of the embodiments described herein will be set forth in the detailed description which follows, and in part will be readily apparent to those skilled in the art from the description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
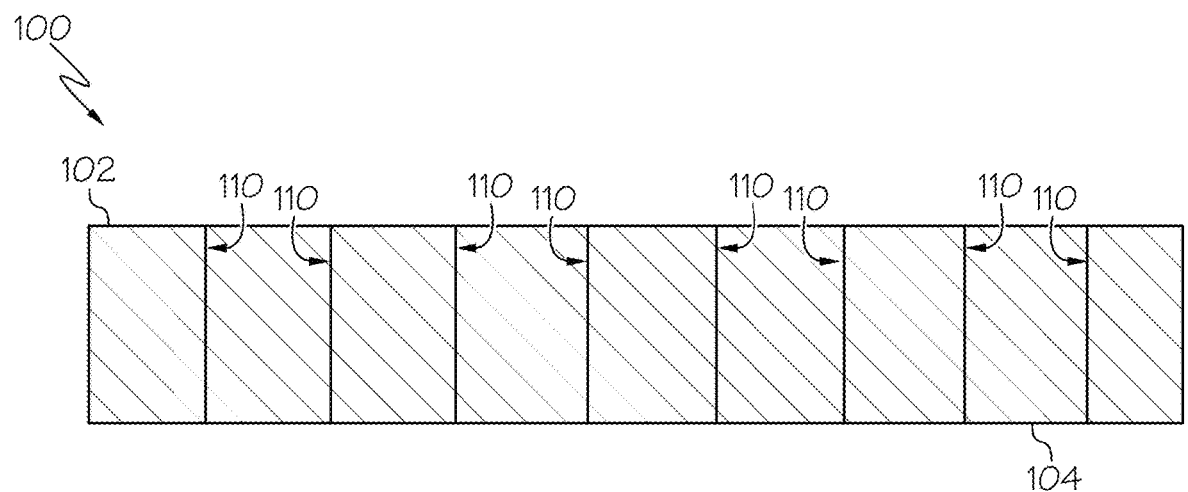
FIG. 1 schematically depicts an example substrate having a plurality of damage tracks formed therein according to one or more embodiments described and illustrated herein.

Referring generally to the figures, embodiments of the present disclosure are generally related to methods for forming holes in substrates. Particularly, embodiments described herein employ a laser-damage-and-etch process to form one or more damage tracks within the substrate, and then subsequently etch the substrate such that one or more holes are formed within the substrate. In some embodiments, the substrate is a glass-based substrate, such as glass and glass-ceramics. Such glasses may be, for example, Corning Eagle XG® glass, Corning Willow® Glass, Corning code 2318 glass, Corning code 2320 glass, Corning Lotus™ NXT glass, or high purity fused silica. In embodiments, pulsed, quasi-non-diffracting laser beams are applied through a substrate to form the one or more damage tracks through the substrate. An etching solution is then applied to the substrate to open up the one or more damage tracks into one or more through holes. However, as described in more detail below, Fresnel reflections of the pulsed quasi-non-diffracting laser beam at the exit surface of the substrate and back into the bulk of the substrate may introduce undesirable microcracks and/or voids extending laterally from the one or more damage tracks at a location closer to the exit surface than the entrance surface. These microcracks and/or voids may create undesirable defects within the holes following the etching process, such as hole walls having a high surface roughness, and high circularity values, as described in more detail below.

Electrically non-conducting substrates, such as silicon glass, ceramic, glass-ceramic, sapphire, and the like, may be used as an interposer disposed between electrical components (e.g., printed circuit boards, integrated circuits, and the like). Metallized through-substrate vias (TSVs) provide a path through the interposer for electrical signals to pass between opposite sides of the interposer. These substrates may also be used as a redistribution layer in an electronics assembly. As an example and not a limitation, glass-based substrates such as glass and glass-ceramics may have desirable electrical properties in high-frequency applications, such as low electrical loss at high frequencies. Further, such glass-based materials have excellent thermal dimensional stability due to a low coefficient of thermal expansion (CTE).

In some embodiments, the substrates described herein may be fabricated from any material that is transparent to at least one wavelength of a laser beam used to form the at least one damage track. As used herein, "transparent" means that the material has an optical loss, such as absorption or scattering, of less than about 20% per mm of material depth, such as less than about 10% per mm of material depth for the specified pulsed laser wavelength, or such as less than about 1% per mm of material depth for the specified pulsed laser wavelength. The absorption of the substrate may be measured using a spectrophotometer, such as a Cary 5000 sold by Agilent Technologies of Santa Clara, Calif. Example substrate materials include, but are not limited to borosilicate glass, soda-lime glass, aluminosilicate glass, alkali aluminosilicate glass, alkaline earth aluminosilicate glass, alkaline earth boro-aluminosilicate glass, fused silica, crystalline materials such as sapphire, silicon, gallium arsenide, glass-ceramic, or silicon materials or combinations thereof.

The holes formed within the substrate may be filled by an electroplating process wherein electrically conductive material (e.g., copper) is coated on the interior surfaces of the hole and continuously built up until the via is hermetically sealed. It should be understood that any process that successfully metallizes the holes to form the TSVs may be utilized. However, roughness caused by the microcracks and/or voids described above may lead to non-uniform metal coatings inside of the hole, which may result in inadequate electrical conductivity or mechanical reliability issues.

Some embodiments described herein may suppress the formation of microcracks and/or voids during the laser damage process by use of an exit material applied to an exit surface of the substrate. This exit material, which may be one or more layers of material, reduces the back reflections of the laser back into the bulk of the substrate. Damage tracks formed with an exit material applied to the exit surface of the substrate are shown to have fewer microcracks and/or voids along the damage track than substrates without an exit material applied to the exit surface. Thus, the resulting holes following the chemically etching process have a smoother surface than holes formed by a laser process that does not employ an exit material applied to the exit surface of the substrate.

Some embodiments of methods for forming holes in substrates are described in detail below.

Referring now to FIG. 1, an example substrate 100 having a plurality of damage tracks 110 formed therein is schematically illustrated. The substrate 100 may be fabricated from any suitable material that is transparent to at least one wavelength of a laser beam used to form the damage tracks 110 as described in more detail below. The substrate 100 may have any suitable thickness depending on the end-application, including, but not limited to 0.05 mm to 10 mm, including endpoints. In some embodiments, the thickness of the substrate 100 is within a range of 0.1 mm to 0.7 mm, including endpoints. The damage tracks 110 are formed within a bulk of the substrate 100 between an entrance surface 102 (i.e., a first surface) and an exit surface 104 (i.e., a second surface). Damage tracks 110 are lines formed within a bulk of the substrate 100 having a substrate material that is modified by laser-induced multi-photon absorption, as described in more detail below. The damage tracks 110 may be a narrow hole that extends through the substrate 100, or may be a non-continuous channel that is interrupted by substrate material.

Figure 2:
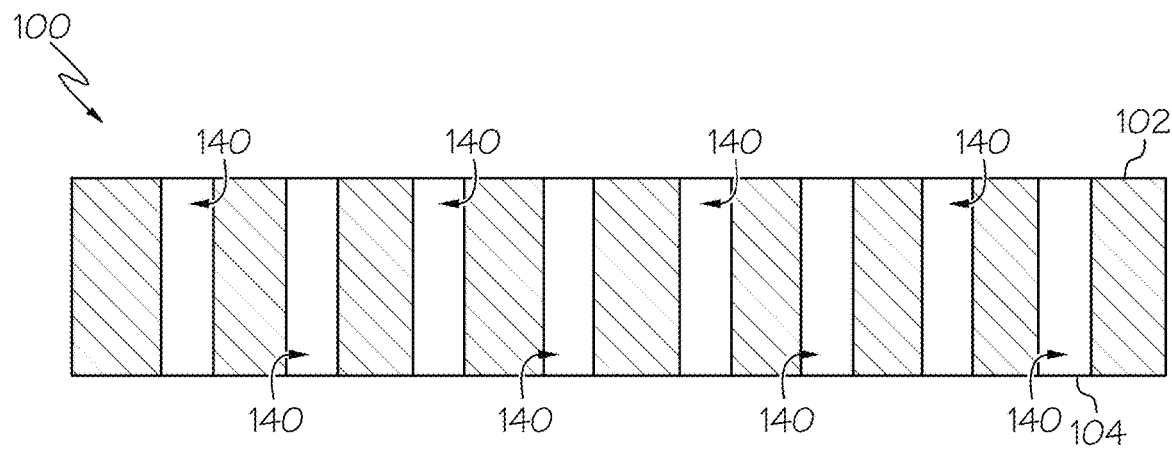
FIG. 2 schematically depicts an example substrate having a plurality of holes formed therein according to one or more embodiments described and illustrated herein.

It is noted that when the damage tracks 110 are formed completely from the entrance surface 102 to the exit surface 104, through-holes disposed entirely through the substrate 100 will be formed after etching, such as the through-holes 140 depicted in FIG. 2. When the damage tracks 110 do not reach either the entrance surface 102 or the exit surface 104, blind holes may be formed after etching. The damage tracks 110 are formed by application of a quasi-non-diffracting laser beam through the bulk of the substrate 100, as described in detail below and schematically illustrated by FIG. 3.

After the damage tracks 110 are formed, the substrate 100 is then subjected to a chemical etchant. Etchants are not limited by the present disclosure. Typical etchants that may be used include, but are not limited to hydrogen fluoride acid mixtures, and also basic solutions such as potassium hydroxide and sodium hydroxide. The damage tracks 110 are regions within the bulk of the substrate 100 having been damaged by the laser beam. The etch rate of the damage tracks 110 is greater than the etch rate of non-damaged regions of the substrate 100. The increased etch rate of the damage tracks 110 allow holes 140 to open up at the damage tracks 110 during etching, as schematically shown in FIG. 2. Although the holes 140 are illustrated in FIG. 2 as being substantially cylindrical, embodiments are not limited thereto. Holes 140 formed by the laser-damage-and-etch techniques described herein may have an hourglass shape such that they have a hole waist with a diameter that is smaller than a diameter of the hole openings at the entrance surface 102 and the exit surface 104. As an example and not a limitation, a diameter of the hole openings of the holes 140 may be between 1 μm and 150 μm, including endpoints. However, other hole-opening diameters may be formed. Example laser and etching conditions to form damage tracks and resulting holes in the substrates are described in U.S. Pat. No. 9,517,963, which is hereby incorporated by reference in its entirety.

Following the etching process, in some embodiments the holes 140 are coated or otherwise filled with an electrically conductive material in a metallization process to provide electrical conductivity between a top and a bottom of the holes 140. The electrically conductive material is not limited by this disclosure. Any known or yet-to-be-developed process for metalizing the holes 140 may be utilized (e.g., electroplating).

Figure 3:
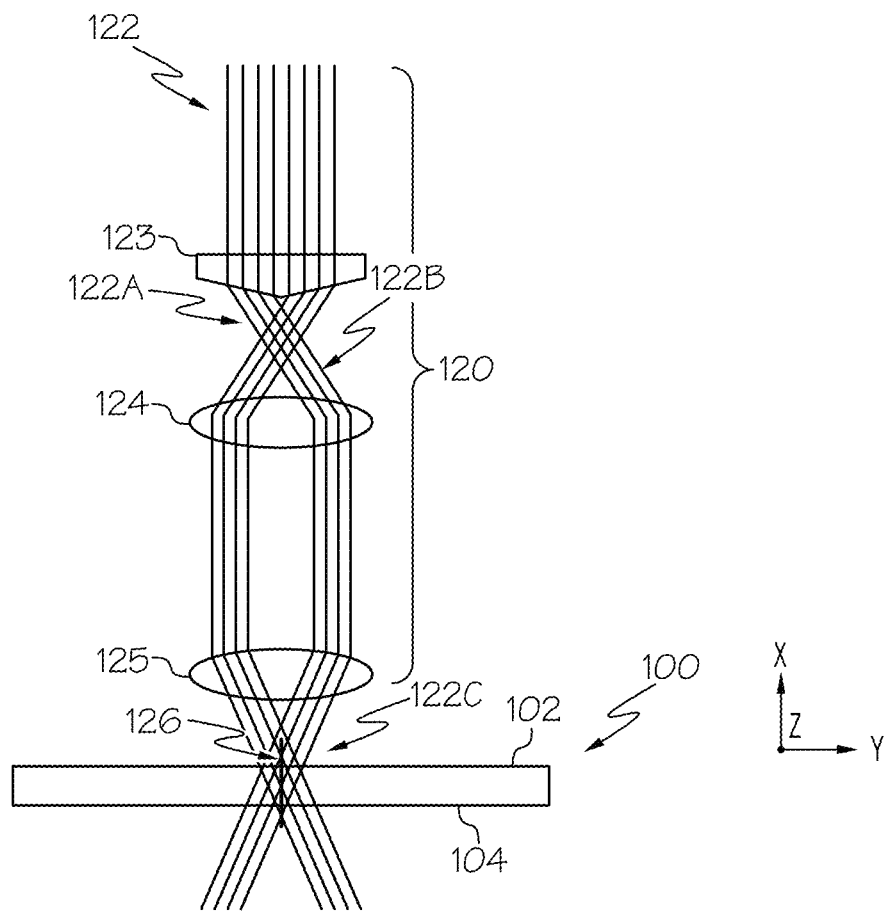
FIG. 3 schematically depicts an example optical system to produce damage tracks in a substrate according to one or more embodiments described and illustrated herein.

FIG. 3 schematically illustrates an example optical system 120 used to form a pulsed quasi-non-diffracting beam 122C through the substrate 100 to form one or more damage tracks 110. The quasi-non-diffracting beam 122C may form a focal line 126 through the substrate 100. Directing the pulsed quasi-non-diffracting beam 122C into the substrate 100 generates an induced absorption within the substrate 100 and deposits enough energy to break chemical bonds in the substrate 100 to form the damage tracks 110. The optical system 120 may include any optical components capable of producing the quasi-non-diffracting beams 122C described herein. In the embodiment illustrated by FIG. 3, the optical system 120 includes an axicon 123 (i.e., a conical lens), a collimating lens 124, and a focusing lens 125. A pulsed laser beam 122 from a laser source (not shown) passes through the axicon 123, which creates a primary quasi-non-diffracting beam 122A of the pulsed laser beam 122. The primary quasi-non-diffracting beam 122A diverges to form a ring beam 122B that is received by the collimating lens 124. The collimating lens 124 and the focusing lens 125 act as a telescope that relays and de-magnifies the primary quasi-non-diffracting beam 122A such that an imaged quasi-non-diffracting beam 122C is provided through the substrate 100. The imaged quasi-non-diffracting beam 122C provides a beam spot on the entrance surface (i.e., the entrance surface 102) of the substrate 100. The telescope may be employed because it projects the primary quasi-non-diffracting beam 122A to a comfortable working distance away from the optical surfaces of the optical system 120, and also allows for the ability to more easily control the size of the focal line 126 defined by the quasi-non-diffracting beam 122C.

As a non-limiting example, the pulsed laser beam 122 may have a wavelength within a range from 200 nm to 2000 nm, including endpoints, for example, without limitation, 1064 nm, 1030 nm, 532 nm, 530 nm, 355 nm, or 266 nm. The laser source is operated to produce a burst of a plurality of pulses having a pulse width. In the examples described herein, each burst includes twenty pulses. However, it should be understood that more or fewer pulses may be provided per burst. The pulse width of the pulses may be within a range of 100 fsec to 10 psec, including endpoints. As described in more detail below, pulse widths in the femtosecond range may be desirable to reduce coherent back reflections that may create microcracks.

The pulsed laser beam can have an average laser burst energy measured, at the substrate, greater than 40 μJ per mm thickness of the substrate. The average laser burst energy used can be as high as 2500 μJ per mm of thickness of substrate, for example 100-2000 μJ/mm, 200-1750 μJ/mm, or 500-1500 μJ/mm. This average laser energy can also be referred to as an average, per-burst, linear energy density, or an average energy per laser burst per mm thickness of substrate. As stated above, additional laser parameters to form damage tracks within substrates to create etched holes are described in U.S. Pat. No. 9,517,963.

The cross sectional profile of an example quasi-non-diffracting beam 122C can be described by a Bessel function, and hence such laser beams are frequently referred to as Bessel beams. In a non-limiting example, the quasi-non-diffracting beam has a wavelength of about 532 nm and a numerical aperture of about 0.29, which provides a core at the center of the Bessel beam having a diameter of about 1.2 μm. The intensity of the laser beam in this core spot can be maintained over lengths of hundreds of microns, which is much longer than the diffraction limited Rayleigh range of a typical Gaussian profile beam of equivalent spot size (i.e., only a few microns).

Figure 4A:
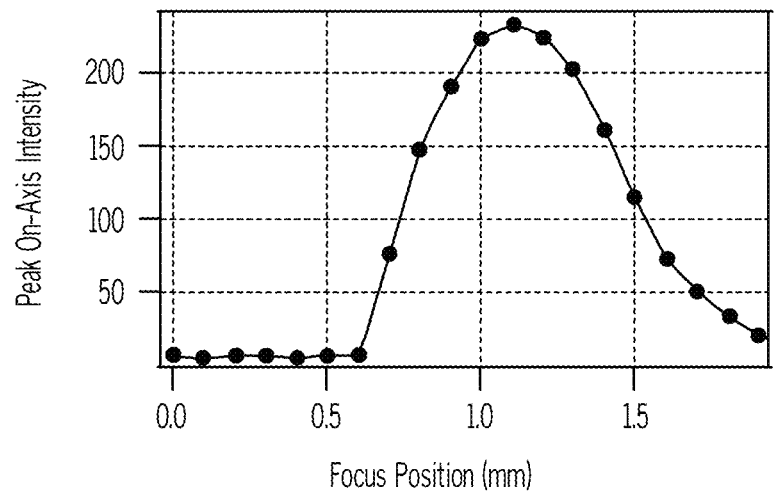
FIG. 4A graphically depicts an example Gauss-Bessel beam intensity profile along an optical axis according to one or more embodiments described and illustrated herein.

Such an optical system 120 as shown in FIG. 3 can be thought of as mapping the radial (i.e., lateral) intensity distribution of the input pulsed laser beam 122 to an intensity distribution along the optical axis to form a focal line. With a typical Gaussian beam from a laser illuminating this optical system 120, the actual intensity along the optical axis will take the form as shown in FIG. 4A. The length of the focal line that is produced is proportional to the diameter of the pulsed laser beam 122 sent into the axicon 123. Such a quasi-non-diffracting beam is known as a Gauss-Bessel beam.

Figure 4B:
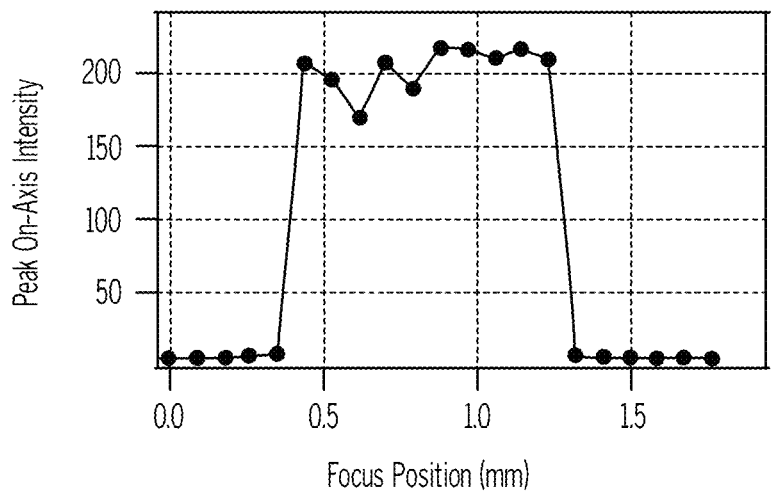
FIG. 4B graphically depicts an example top-hat intensity profile along an optical axis of a laser beam produced by a waxicon system according to one or more embodiments described and illustrated herein.

It is noted that the pulsed laser beam 122 used to illuminate the optical system 120 need not have a Gaussian profile, and additionally one need not use an axicon 123 to form the quasi-non-diffracting beam 122C. Thus, it is possible to form different energy distributions along the optical axis, where the intensity may take the form of a "top hat" profile, or other profile shape. As shown in FIG. 4B, this provides the ability to more uniformly distribute the energy through the depth of the substrate 100, or to tailor the energy distribution so that certain regions of the substrate 100 receive more or less energy than others in a deterministic manner. The creation of such optics is described in U.S. Patent Publication US 2018-0062342, which is incorporated by reference herein in its entirety.

As stated above, the length of the quasi-non-diffracting beam 122C is determined by its Rayleigh range. Particularly, the quasi-non-diffracting beam 122C defines a laser beam focal line 126 having a first end point and a second end point each defined by locations where the quasi-non-diffracting beam has propagated a distance from the beam waist equal to a Rayleigh range of the quasi-non-diffracting beam. A detailed description of the formation of quasi-non-diffracting beams and determining their length, including a generalization of the description of such beams to asymmetric (such as non-axisymmetric) beam cross sectional profiles, is provided in U.S. patent application Ser. No. 15/718,848 and Dutch Patent Application No. 2017998, which are incorporated by reference in their entireties.

The Rayleigh range corresponds to the distance (relative to the position of the beam waist as defined in Section 3.12 of ISO 11146-1:2005(E)) over which the variance of the laser beam doubles (relative to the variance at the position of the beam waist) and is a measure of the divergence of the cross sectional area of the laser beam. The Rayleigh range can also be observed as the distance along the beam axis at which the peak optical intensity observed in a cross sectional profile of the beam decays to one half of its value observed in a cross sectional profile of the beam at the beam waist location (location of maximum intensity). The quasi-non-diffracting beam defines a laser beam focal line having a first end point and a second end point. The first and second end points of a quasi-non-diffracting beam are defined as the locations where the quasi-non-diffracting beam has propagated a distance from the beam waist equal to a Rayleigh range of the quasi-non-diffracting beam. Laser beams with large Rayleigh ranges have low divergence and expand more slowly with distance in the beam propagation direction than laser beams with small Rayleigh ranges.

Beam cross section is characterized by shape and dimensions. The dimensions of the beam cross section are characterized by a spot size of the beam. For a Gaussian beam, spot size is frequently defined as the radial extent at which the intensity of the beam decreases to $1/e^2$ of its maximum value. The maximum intensity of a Gaussian beam occurs at the center (x=0 and y=0 (Cartesian) or r=0 (cylindrical)) of the intensity distribution and radial extent used to determine spot size is measured relative to the center.

Beams with Gaussian intensity profiles may be less preferred for laser processing to form damage tracks 110 because, when focused to small enough spot sizes (such as spot sizes in the range of microns, such as about 1-5 μm or about 1-10 μm) to enable available laser pulse energies to modify materials such as glass, they are highly diffracting and diverge significantly over short propagation distances. To achieve low divergence, it is desirable to control or optimize the intensity distribution of the pulsed laser beam to reduce diffraction. Pulsed laser beams may be non-diffracting or weakly diffracting. Weakly diffracting laser beams include quasi-non-diffracting laser beams. Representative weakly diffracting laser beams include Bessel beams, Gauss-Bessel beams, Airy beams, Weber beams, and Mathieu beams.

Non-diffracting or quasi-non-diffracting beams generally have complicated intensity profiles, such as those that decrease non-monotonically vs. radius. By analogy to a Gaussian beam, an effective spot size $w_{o,eff}$ can be defined for any beam, even non-axisymmetric beams, as the shortest radial distance, in any direction, from the radial position of the maximum intensity (r=0) at which the intensity decreases to $1/e^2$ of the maximum intensity. Further, for axisymmetric beams $w_{o,eff}$ is the radial distance from the radial position of the maximum intensity (r=0) at which the intensity decreases to $1/e^2$ of the maximum intensity. A criterion for Rayleigh range based on the effective spot size $w_{o,eff}$ for axisymmetric beams can be specified as non-diffracting or quasi-non-diffracting beams for forming damage regions in Equation (1), below:

$$Z_R > F_D \frac{\pi w_{0,eff}^2}{\lambda} \qquad (1)$$

where $F_D$ is a dimensionless divergence factor having a value of at least 10, at least 50, at least 100, at least 250, at least 500, at least 1000, in the range from 10 to 2000, in the range from 50 to 1500, in the range from 100 to 1000. For a non-diffracting or quasi-non-diffracting beam the distance, $Z_R$ in Equation (1), over which the effective beam size doubles, is $F_D$ times the distance expected if a typical Gaussian beam profile were used. The dimensionless divergence factor $F_D$ provides a criterion for determining whether or not a laser beam is quasi-non-diffracting. As used herein, the pulsed laser beam 122 is considered quasi-non-diffracting if the characteristics of the laser beam satisfy Equation (1) with a value of $F_D \geq 10$. As the value of $F_D$ increases, the pulsed laser beam 122 approaches a more nearly perfectly non-diffracting state.

Figure 5:
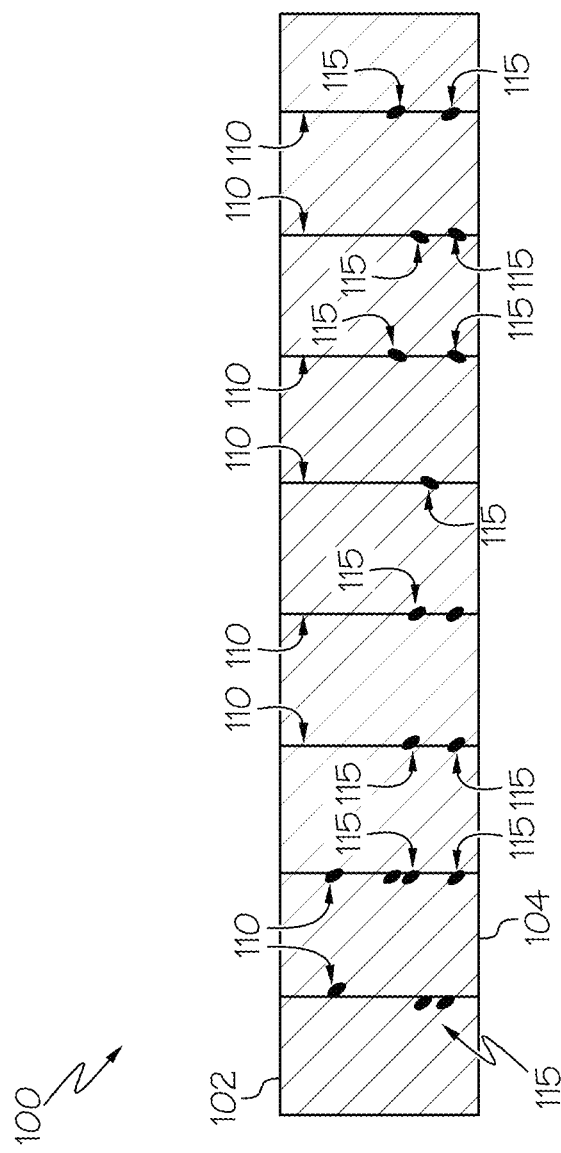
FIG. 5 schematically depicts an example substrate having damage tracks with microcracks extending therefrom.

Referring now to FIG. 5, a pulsed quasi-non-diffracting beam 122C may create microcracks 115 along the damage tracks 110 closer to the exit surface (i.e., the exit surface 104) than the entrance surface (i.e., the entrance surface 102). The microcracks 115 may include crack lines or voids within the substrate 100 extending within and from the damage tracks 110. As discussed above, these microcracks 115 may lead to undesirable effects after etching the holes 140, such as high average interior surface roughness (e.g., Ra greater than 2 μm) and high circularity values (e.g. >5 microns) Circularity is described in detail below with reference to FIGS. 13A and 15A-18.

Figure 6:
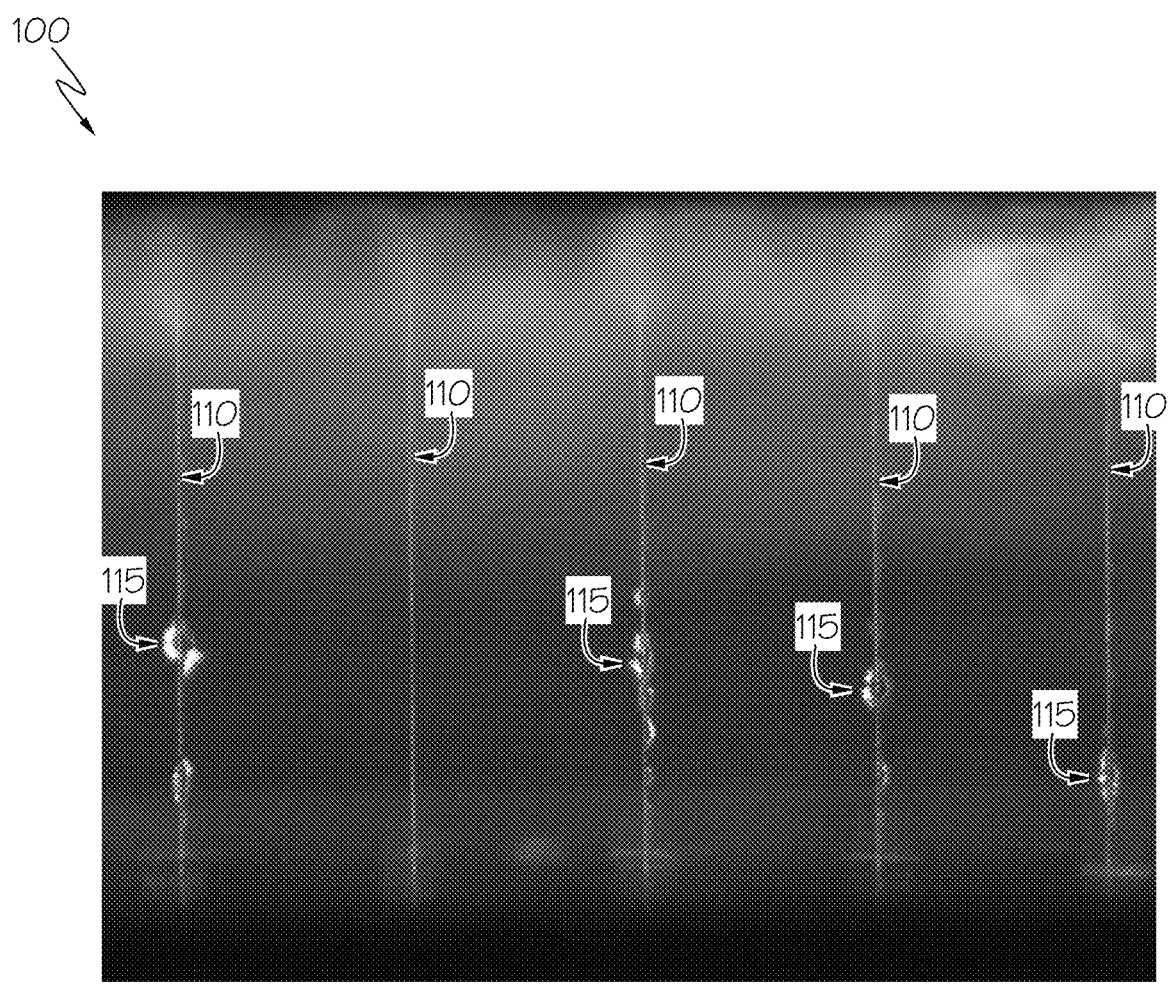
FIG. 6 is an image of a glass substrate having damage tracks with microcracks extending therefrom.
Figure 7A:
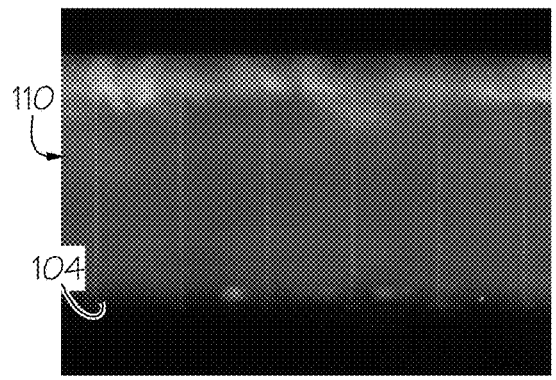
FIG. 7A is an image of damage tracks within a glass substrate formed by a laser beam with a laser burst energy of 90 µJ.
Figure 7B:
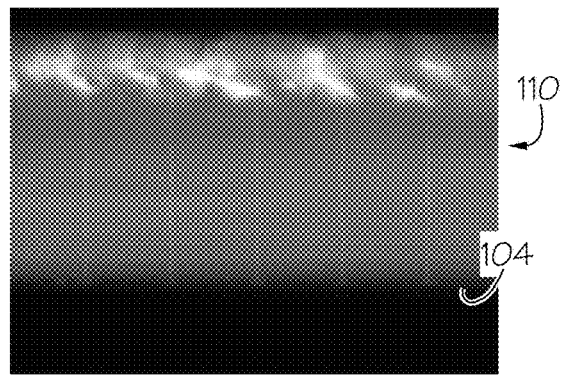
FIG. 7B is an image of damage tracks within a glass substrate formed by a laser beam with a laser burst energy of 100 µJ.
Figure 7C:
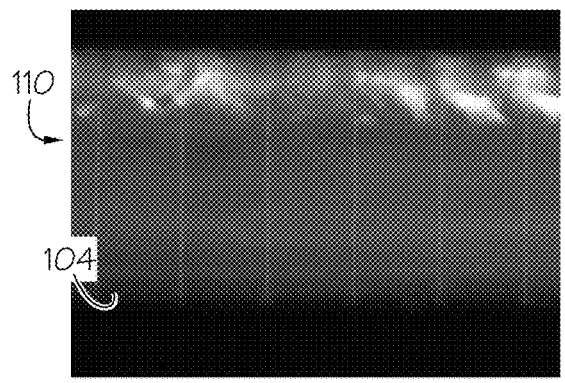
FIG. 7C is an image of damage tracks within a glass substrate formed by a laser beam with a laser burst energy of 110 µJ.
Figure 7D:
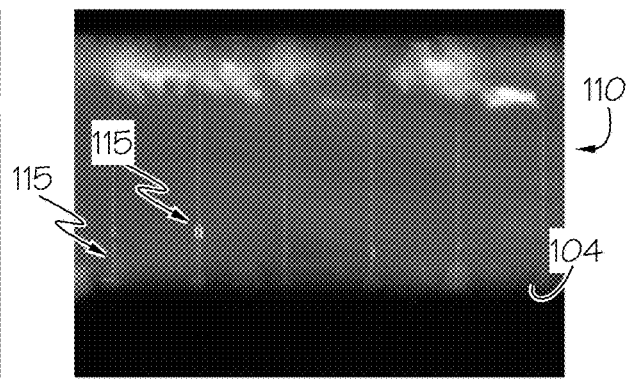
FIG. 7D is an image of damage tracks within a glass substrate formed by a laser beam with a laser burst energy of 120 µJ.
Figure 7E:
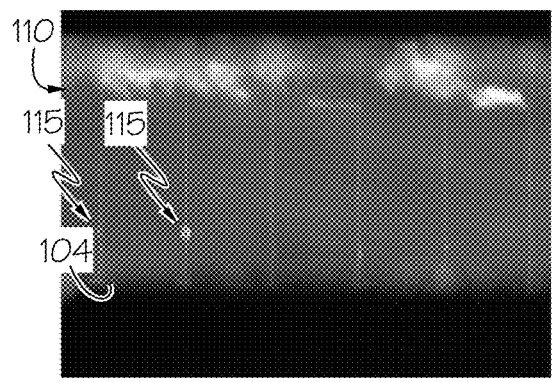
FIG. 7E is an image of damage tracks within a glass substrate formed by a laser beam with a laser burst energy of 130 µJ.
Figure 7F:
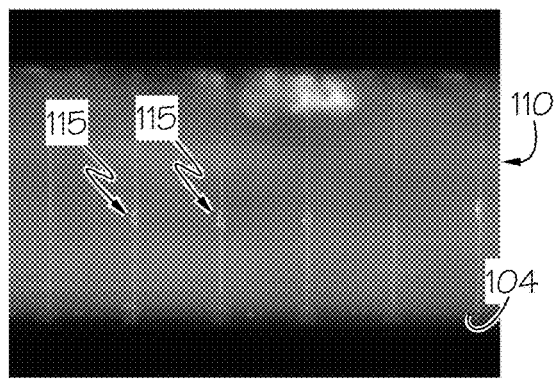
FIG. 7F is an image of damage tracks within a glass substrate formed by a laser beam with a laser burst energy of 140 µJ.
Figure 7G:
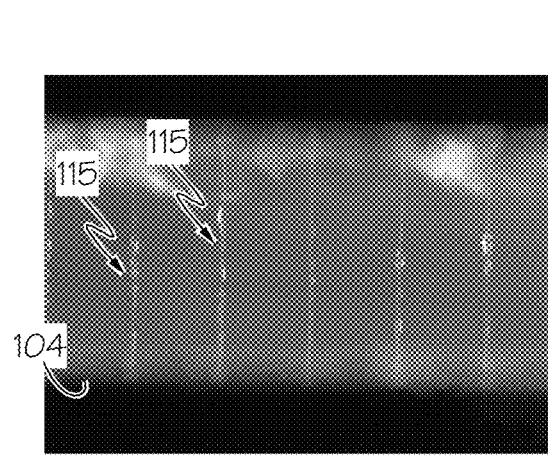
FIG. 7G is an image of damage tracks within a glass substrate formed by a laser beam with a laser burst energy of 150 µJ.
Figure 7H:
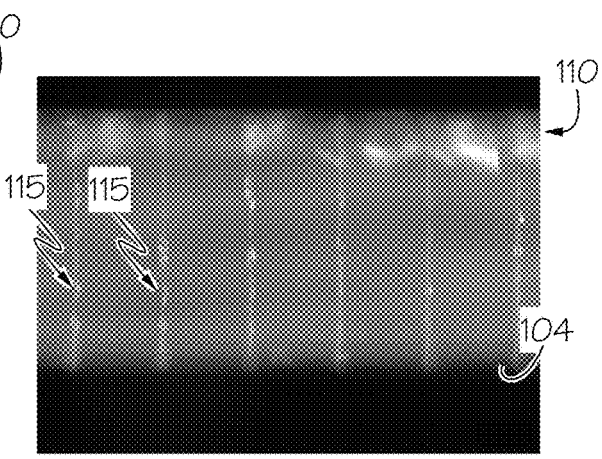
FIG. 7H is an image of damage tracks within a glass substrate formed by a laser beam with a laser burst energy of 160 µJ.

FIG. 6 is an optical microscope digital image of damage tracks 110 formed within a substrate 100 fabricated from 400 μm alkaline earth boro-aluminosilicate glass manufactured and sold under the trade name EAGLE XG® by Corning, Inc. of Corning, N.Y. A quasi-non-diffracting beam 122C having a focal line 126 length of about 0.9 mm was pulsed at 20 pulses per burst and provided 120 μJ of energy per burst. The wavelength of the laser was 532 nm, the pulse width was 7 psec, with 20 nsec between each pulse. One burst was applied per damage track (one burst per hole). As shown in FIG. 6, small microcracks 115 are clustered near the exit surface (i.e., exit surface 104) of the substrate 100.

To illustrate how energy per burst affects the formation of microcracks 115, several substrates having a thickness and composition as the example illustrated by FIG. 6 were processed using the same laser conditions as the example illustrate by FIG. 6 except that the energy per burst was varied. FIGS. 7A-7H illustrate digital images of damage tracks 110 resulting from an energy per burst as indicated in each figure. At energies per burst of 1200 and above, microcracks 115 are clustered near the exit surface 104. As the energy per pulse is increased further, the microcracks 115 become stronger and the range of depths over which they are present increases. In all cases, the microcracks 115 tend to be clustered or most numerous near the exit surface 104. It is noted that for low energies (≤110 μJ/burst), no microcracks 115 are observed in the corresponding images. However, only a small number of damage tracks 110 are shown in each image. Inspection of larger numbers of damage tracks 110 almost always reveals the presence of microcracks 115 near the exit surface 104, although on a small fraction of the holes (e.g., 1% or even 0.1%). However, even a small fraction of holes with higher roughness may be of concern for metallization processes. Furthermore, for energies per burst at the lower end of this regime, the damage tracks 110 are often too weak to allow for reliable and thorough etchant penetration to form well-opened holes, resulting in numerous holes with tight waists to the final hourglass hole profile.

Additionally, sample glass substrates having the same thickness and composition as described above with respect to the sample shown in FIG. 6 were laser-processed to evaluate the effect of the location of the laser beam focal line defined by the quasi-non-diffracting beam on the formation of micro cracks 115. The laser beam parameters were the same as described above with respect to FIG. 6. FIGS. 8A-8F illustrate the resulting damage tracks 110 in substrates when shifting the distance between the substrate and the optics used to create the quasi-non-diffracting beam and resulting focal line.

Figure 8A:
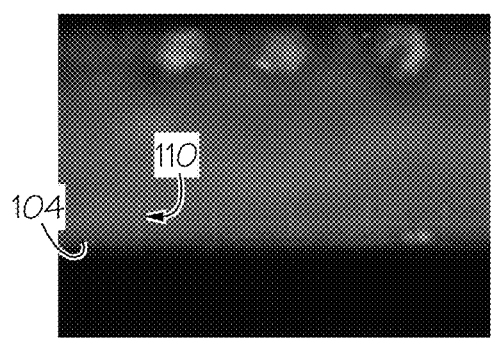
FIG. 8A is an image of damage tracks within a glass substrate formed by a quasi-non-diffracting beam with a position of the quasi-non-diffracting beam offset from a nominal position by −400 µm.
Figure 8B:
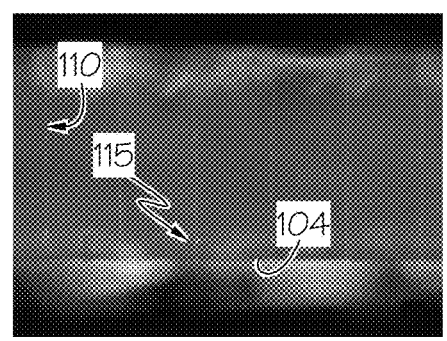
FIG. 8B is an image of damage tracks within a glass substrate formed by a quasi-non-diffracting beam with a position of the quasi-non-diffracting beam offset from a nominal position by −300 µm.
Figure 8C:
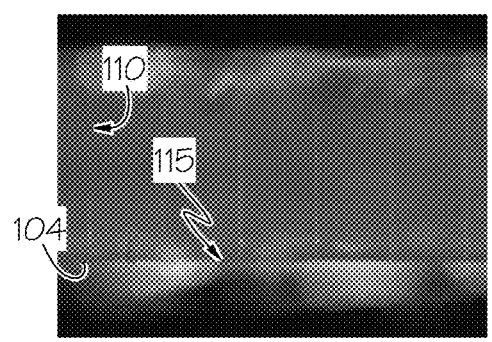
FIG. 8C is an image of damage tracks within a glass substrate formed by a quasi-non-diffracting beam with a position of the quasi-non-diffracting beam offset from a nominal position by −150 µm.
Figure 8D:
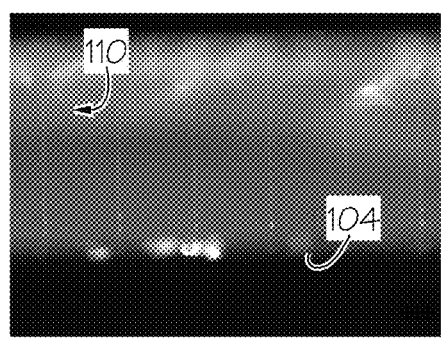
FIG. 8D is an image of damage tracks within a glass substrate formed by a quasi-non-diffracting beam with a position of the quasi-non-diffracting beam offset from a nominal position by +150 µm.
Figure 8E:
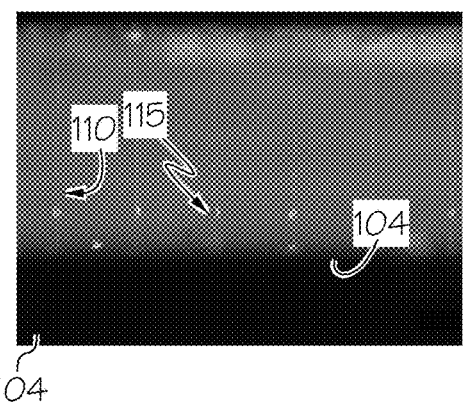
FIG. 8E is an image of damage tracks within a glass substrate formed by a quasi-non-diffracting beam with a position of the quasi-non-diffracting beam offset from a nominal position by +300 µm.
Figure 8F:
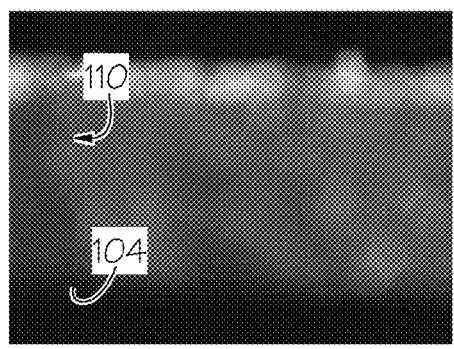
FIG. 8F is an image of damage tracks within a glass substrate formed by a quasi-non-diffracting beam with a position of the quasi-non-diffracting beam offset from a nominal position by +400 µm.

FIG. 8A is an image of damage tracks within a glass substrate formed by a quasi-non-diffracting beam with a position of the quasi-non-diffracting beam offset from a nominal position by −400 μm. FIG. 8B is an image of damage tracks with a position of the quasi-non-diffracting beam offset from a nominal position by −300 μm. FIG. 8C is an image of damage tracks with a position of the quasi-non-diffracting beam offset from a nominal position by −150 μm. FIG. 8D is an image of damage tracks with a position of the quasi-non-diffracting beam offset from a nominal position by +150 μm. FIG. 8E is an image of damage tracks with a position of the quasi-non-diffracting beam offset from a nominal position by +300 μm. FIG. 8F is an image of damage tracks with a position of the quasi-non-diffracting beam offset from a nominal position by +400 μm.

It is noted that the reference or nominal zero position of the focal line is such that the focal line is centered upon the thickness of the substrate, so that approximately equal amounts of the focal line extend both above and below the substrate. FIGS. 8B-8E illustrate that moving a position of the optics within a range of −300 μm to +300 μm does not significantly change a position of the microcracks 115 along the damage tracks 110. The microcracks 115 remain clustered near the exit surface of the substrate, and do not move along with the shifted position of the optics. Only for ±400 μm changes in focal position are changes in the position of the microcracks 115 observed, in which cases the focal line is now moved so severely that the majority of the length of the focal line is located outside of the substrate.

The examples illustrated by FIGS. 7A-7H and 8A-8F illustrate that the microcracks are in an approximately fixed location with respect to the exit surface of the substrate, and grow in extent as the energy per burst is increased. Without being bound by theory, the microcracks may be formed by Fresnel reflections from the exit surface (i.e., exit surface 104) of the substrate that focus-fold some fraction of light back onto the focal line itself.

Figure 9:
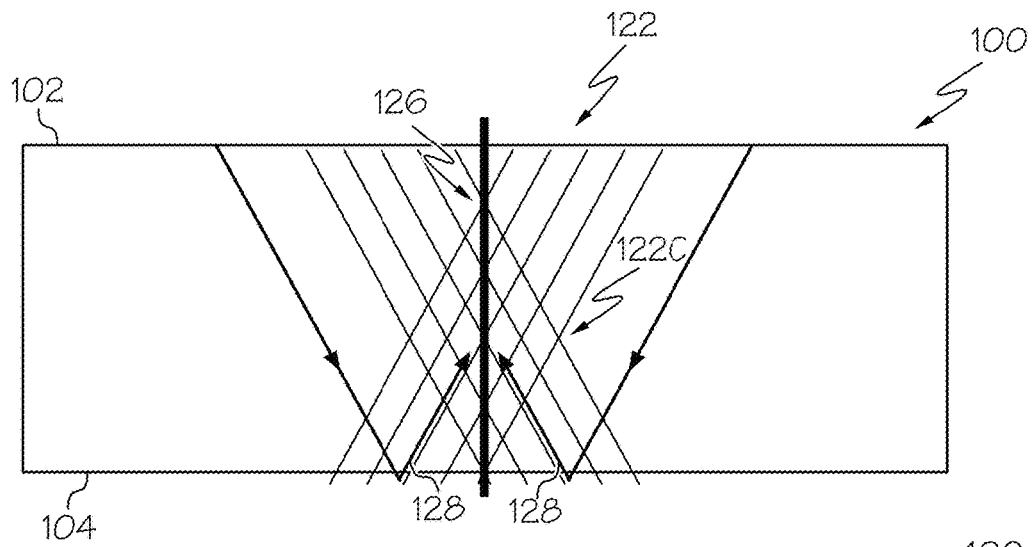
FIG. 9 schematically depicts an example substrate and back reflections of a quasi-non-diffracting beam at an exit surface of the substrate.

Referring to FIG. 9, a pulsed laser beam 122 is conditioned to form a quasi-non-diffracting beam 122C that creates a focal line 126 within a bulk of the substrate 100 to form a damage track 110 as described above. A portion 128 of the pulsed laser beam 122 is back reflected at the interface between the material of the substrate 100 and the atmosphere by Fresnel reflection. This portion 128 of the pulsed laser beam 122 may form another focal line within the substrate 100 having a length that is proportional to a length of the original focal line 126 that extends beneath the substrate (i.e., outside of the exit surface 104).

Because the pulsed laser beam 122 has a short pulse width (e.g., about 7 psec to about 11 psec), the coherence length is on the order of millimeters, and thus the portion 128 of light that is back-reflected is also coherent with the input pulsed laser beam 122. This coherence reflection interferes with the original focal line 126. Thus, there may be significantly more intensity enhancement than would arise with incoherent reflections. This enhanced intensity proximate the exit surface of the substrate 100 may cause the microcracks along the damage tracks 110.

Referring to FIG. 9, some embodiments of the present disclosure mitigate the Fresnel reflections and the formation of undesirable microcracks and/or voids by applying an exit material 130 to the exit surface 104 of the substrate 100 prior to laser processing. An exit material 130 having a refractive index that reduces the Fresnel reflection at the exit surface 104 is chosen. In some embodiments, the refractive index of the exit material 130 closely matches the refractive index of the substrate 100 such that a difference between the refractive index of the exit material 130 and the refractive index of the substrate 100 is 0.4 or less, 0.2 or less, or 0.1 or less. Such a reduction in refractive index difference can lead to a reduction of the expected reflection intensity at near normal incidence from a typical air to glass interface observed value of 4%, to an reduced reflection intensity 2.5% or less, 0.6% or less, or 0.4% or less at an interface between the exit surface 104 and the exit material 130 when measured at a wavelength within a range of 200 nm to 2000 nm, including endpoints. In a non-limiting example, the reflectivity of the interface is 2.5% or less at a wavelength of 1064 nm±10 nm, 1030 nm±10 nm, and 530 nm±10 nm. Refractive index can change based on wavelength and other parameters. "Refractive index" as used herein refers to the refractive index of a material at the peak wavelength of the laser, and under the conditions at which the material, such as the material of substrate 100 and exit material 130, are exposed to die laser. Related parameters such as reflection intensity are also for the peak wavelength of the laser under the conditions at which substrate 100 and exit material 130 are exposed to the laser.

Figure 10:
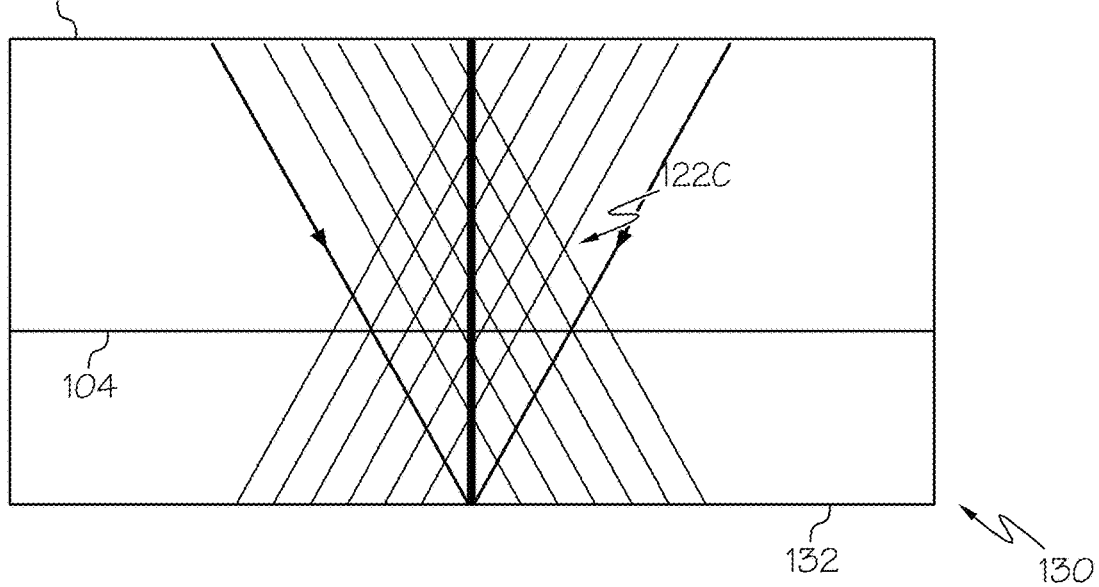
FIG. 10 schematically depicts an example substrate having an example exit material applied to an exit surface to reduce back reflections of the quasi-non-diffracting beam according to one or more embodiments described and illustrated herein.

As shown in FIG. 10, the focal line 126 defined by the quasi-non-diffractive beam 122C extends below the interface between the exit surface 104 of the substrate 100 and the exit material 130 such that any Fresnel reflection of the pulsed laser beam 122 occurs outside of the bulk material of the substrate 100. Accordingly, the presence of a coherent reflected focal line within the bulk material of the substrate 100 is reduced or eliminated. It is noted that thicker exit material 130 may be preferred. As shown in FIG. 10, the portion of the focal line 126 that is below the substrate is effectively "folded back" on the original focal line 126 produced by the quasi-non-diffracting beam 122C. If the exit material 130 at the exit surface 104 is thin, there may still be a reflection from the bottom surface 132 of the coating, which may cause a similar problem created by any reflection from the exit surface 104 of the substrate 100. Thus, the exit material 130 should be thick enough so that the focal line exits the bottom surface 132 at a distance great enough to avoid Fresnel reflections into the substrate 100. As non-limiting examples, the exit material 130 has a thickness such that the quasi-non-diffracting beam 122C exits the exit material 130 at a distance of 50 μm or more from the exit surface 104, 75 μm or more from the exit surface 104, 100 μm or more from the exit surface 104, 150 μm or more from the exit surface 104, 200 μm or more from the exit surface 104.

The exit material 130 should be intimately applied to the exit surface 104 of the substrate 100 to ensure that there are substantially no gaps or air bubbles between the exit material 130 and the exit surface 104. For example, if the interface between the exit material 130 and the exit surface is 50% air bubbles, then the exit material 130 may provide a 50% decrease in effectiveness. If an air bubble is present at a position where the quasi-non-diffracting beam passes, Fresnel reflections may occur and create microcracks at the resulting damage track 110. Thus, the exit material 130 should be applied to the exit surface 104 such that the reflectivity at the interface where a hole is desired is 2.5% or less. In some embodiments, the reflectivity at the interface is 2.5% or less within a predetermined region of a damage track 110 to ensure prevention of microcracks. As an example and not a limitation, the predetermined region may have a diameter of 300 µm and surround the damage track 110. In other words, no air gaps or other interfering materials should be present between the exit material 130 and the exit surface 104 within a predetermined region surrounding the damage track 110.

Figure 11:
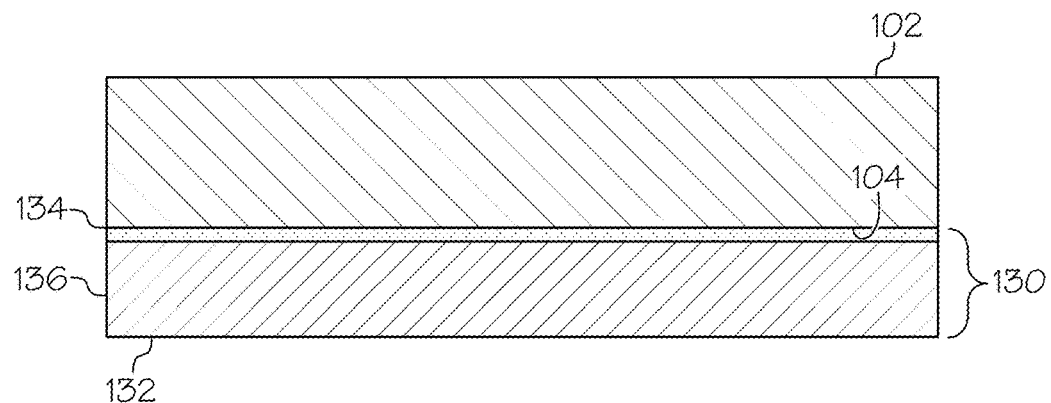
FIG. 11 schematically depicts an example substrate having an example exit material including a water layer and a glass layer according to one or more embodiments described and illustrated herein.

The exit material 130 may be made from a single layer of material, or of multiple, stacked layers. FIG. 11 schematically illustrates an exit material 130 comprising a layer of water 134 (or other material) disposed between the exit surface 104 of the substrate 100 and an additional substrate 136 (i.e., a supporting substrate). As an example and not a limitation, the additional substrate 136 may be fabricated from the same material as the substrate 100. In the case where the substrate 100 is fabricated from glass (e.g., a 700 µm thick glass substrate) having a refractive index of about 1.5, a difference in refractive index between the glass and water 134 having a refractive index of about 1.33 is about 0.17, which is smaller than the refractive index difference between glass and air, which is about 0.5. During laser processing, there may be minimal Fresnel reflections at the interface between the substrate 100 and the water 134 because of the closely matched refractive indices.

The exit material 130 may be any material(s) having a refractive index that closely matches the refractive index of the material of the substrate 100. Other materials include, but are not limited to, polymers (e.g., polyethylene film), glass-based materials, optical glue (e.g., NOA 63 sold by Norland Products, Inc. of Cranbury, N.J.), blue photoresist (e.g., D15133640 21×100 MX5015 CS1 3 sold by E. I. du Pont de Nemours and Company of Wilmington, Del.), silicone layer on polyester substrate (e.g., PF-20-X0 and PF-20-X4 PF Film sold by Gel-Pak® of Hayward, Calif.), anti-reflective coatings (e.g., coating code UV sold by Thor Labs of Newton, N.J.), and combinations thereof. Of the exit materials evaluated, the following non-limiting material systems showed to be good candidates for microcrack mitigation:

- NOA 63 optical glue disposed between the exit surface of the substrate and a glass substrate;
- polyethylene film (e.g., YY-100-011B PE self stick film sold by Donguan Yunyan Industrial Co., Ltd of applied to the exit surface of the substrate;
- blue photoresist applied to the exit surface of the substrate and water disposed between the blue photoresist layer and a glass substrate; and
- PF-20-X4 PF Film sold by Gel-Pak® (silicone layer on polyester substrate).

It should be understood that the exit material 130 is not limited to the materials described above, and other materials having a difference of a refractive indices with respect to the substrate 100 that is less than or equal to 0.4 may be utilized.

To illustrate the effect of an exit material comprising water disposed between an exit surface of a glass substrate and an additional glass substrate, 0.4 mm thick EAGLE XG® glass substrates were laser-processed by a quasi-non-diffracting beam having a focal line length of about 0.9 mm that was pulsed at 20 pulses per burst and provided 1300 of energy per burst. The wavelength of the laser was 532 nm, the pulse width was 7 psec, with 20 nsec between each pulse.

Figure 12A:
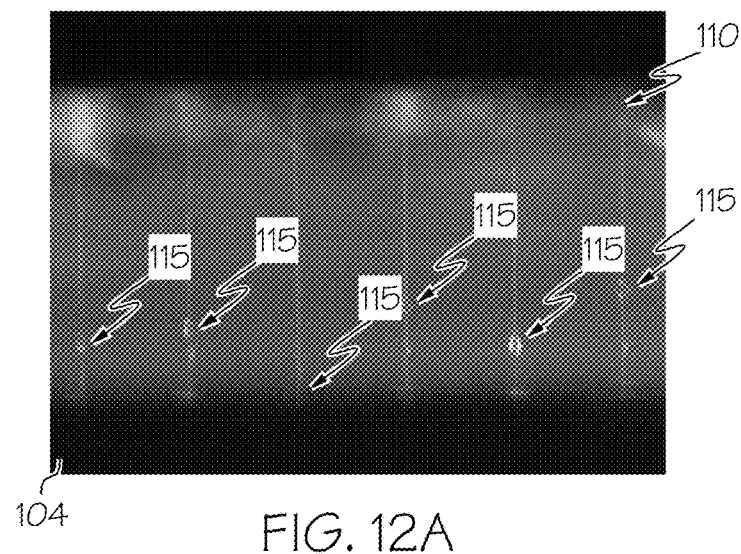
FIG. 12A is an image of a glass substrate processed without an exit material and showing microcracks along damage tracks.
Figure 12B:
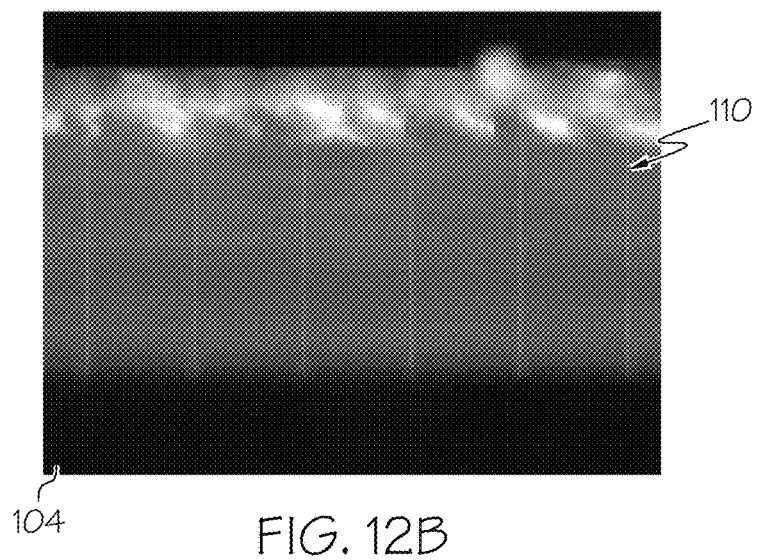
FIG. 12B is an image of a glass substrate processed with water applied on an exit surface and processed using the same laser parameters as the glass substrate depicted by FIG. 12A according to one or more embodiments described and illustrated herein.
Figure 12C:
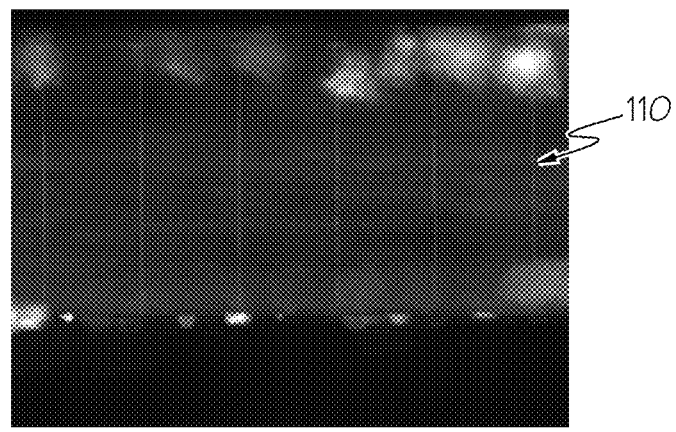
FIG. 12C is an image of a glass substrate processed with a photoresist polymer applied on an exit surface and processed using the same laser parameters as the glass substrates depicted by FIGS. 12A and 12B according to one or more embodiments described and illustrated herein.

One burst was applied per hole. A first sample glass substrate did not include an exit material applied to the exit surface 104 and was used as a baseline (FIG. 12A). A second sample glass substrate had water between an exit surface 104 and an additional 0.7 mm thick EAGLE XG® glass substrate (FIG. 12B). A third sample glass substrate had a 0.35 µm thick photoresist polymer layer (D15133640 21×100 MX5015 CS1 3) applied to the exit surface 104 (FIG. 12C). Microcracks 115 were observed in the first, baseline glass substrate shown in FIG. 12A. However, no microcracks 115 were observed in the second and third sample glass substrates as shown in FIGS. 12B and 12C. Thus, the water and the photoresist polymer layer both prevented the formation of microcracks 115 in the damage tracks 110.

Figure 13A:
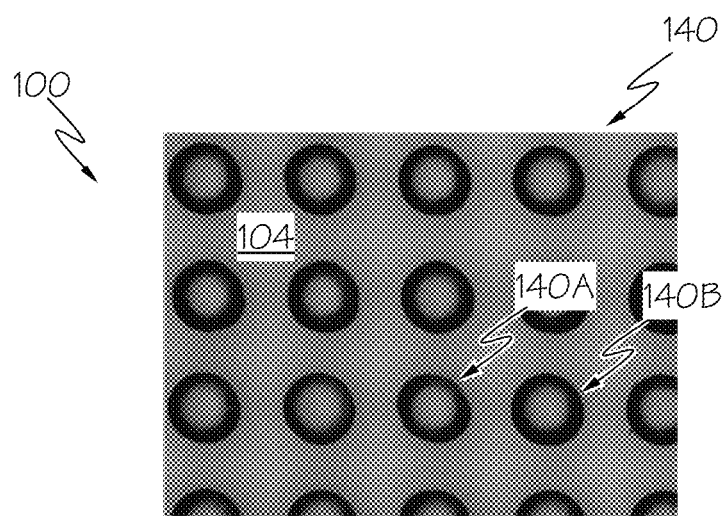
FIG. 13A is a top view of an exit surface of a substrate having holes etched therethrough without an exit material applied to the exit surface during laser processing.
Figure 13B:
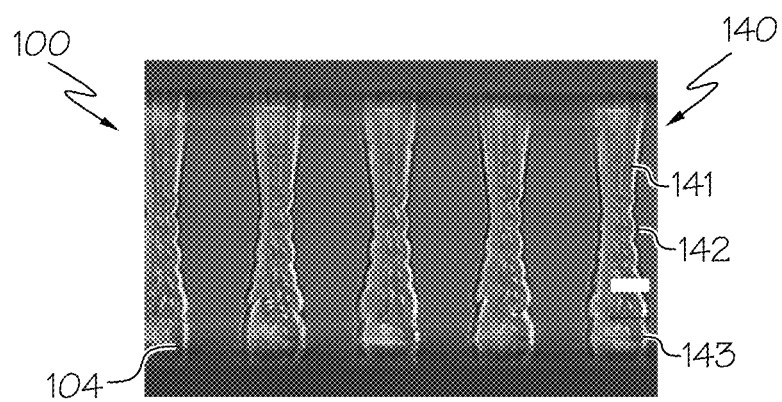
FIG. 13B is a cross sectional side view of the substrate depicted in FIG. 13A.

As stated above, microcracks 115 present within the damage track 110 may cause the resulting etched holes to have a rough surface and a poor (high) circularity. Circularity is defined as a maximum diameter of a hole minus a minimum diameter of a hole determined from an image taken from either then entrance surface 102 or the exit surface 104 of the substrate 100. FIGS. 13A and 13B illustrate a top view of the exit surface 104 and a cross sectional side view, respectively, of a 400 µm thick EAGLE XG® glass substrate 100 having holes formed without an exit material applied to the exit surface 104. Damage tracks 110 (not shown in FIGS. 13A and 13B) were first formed using a quasi-non-diffracting beam having a focal line length of about 0.9 mm that was pulsed at 20 pulses per burst and provided 160 µJ of energy per burst. The wavelength of the laser was 532 nm, the pulse width was 7 psec, with 20 nsec between each pulse. One burst was applied per hole. The glass substrate was then chemically etched to form a plurality of holes 140 that were opened from the damage tracks 110. The etchant was a 1.45M hydrofluoric acid and 1.58M nitric acid solution. Other etchant solutions may be used as well, such as different concentrations of hydrofluoric acid, different concentrations of mineral acids such as hydrochloric acid or nitric acid, or etching with basic solutions instead such as potassium hydroxide or sodium hydroxide.

In the top view of FIG. 13A, the dark circle is the diameter of the exit hole 140 at the exit surface 104 of the glass substrate 100. The post-etch holes 140 show elliptical shapes. Holes 140A and 140B particularly have elliptical shapes, and thus high circularity, which may be undesirable in down-stream processes such as hole metallization to form TSVs. In the cross sectional side view of FIG. 13B, the holes 140 have an hourglass shape having an entrance segment 141, a waist segment 142 and an exit segment 143. The waist segment 142 is narrower than the entrance segment 141 and the exit segment 143. Because of the presence of microcracks 115 closer to the exit surface 104 than the entrance surface 102 in the damage tracks 110 prior to etching, the walls of the exit segment 143 are scalloped in texture, resulting in rough interior surfaces. As described above, rough interior surfaces may negatively impact later metallization processes to fill the hole 140 with electrically conductive material. From FIG. 13A, the interior surface of the exit segment 143 appears to be rougher than that of the entrance segment 141.

Figure 14A:
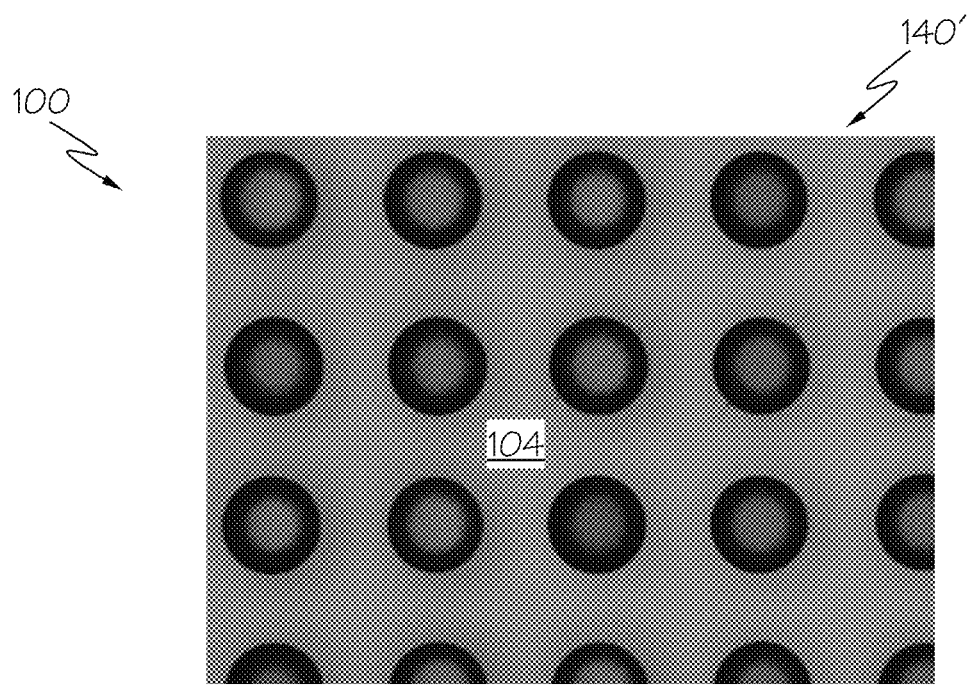
FIG. 14A is a top view of an exit surface of a substrate having holes etched therethrough with a photoresist polymer applied to the exit surface during laser processing according to one or more embodiments described and illustrated herein.
Figure 14B:
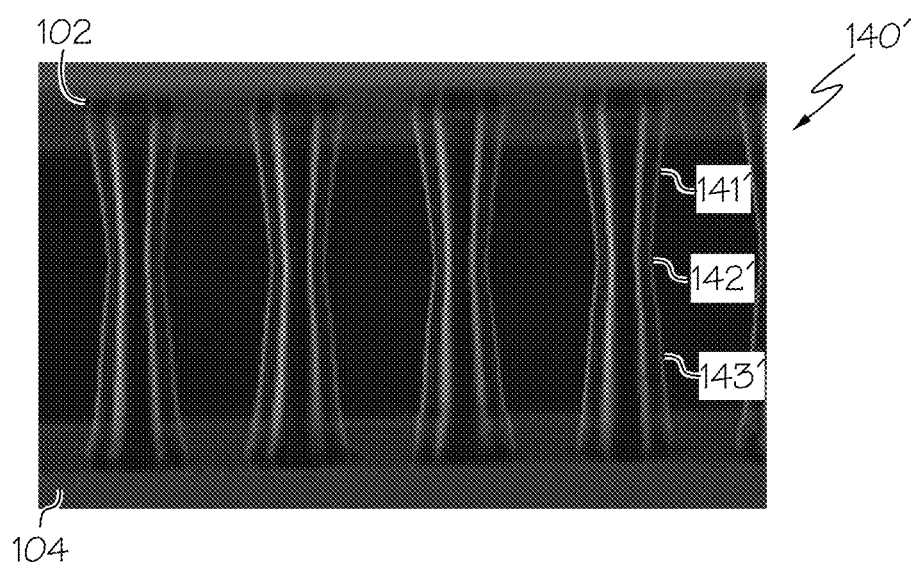
FIG. 14B is a cross sectional side view of the substrate depicted by FIG. 14A.

FIGS. 14A and 14B illustrate a top view of the exit surface 104 and a cross sectional side view, respectively, of a 400 µm thick EAGLE XG® glass substrate 100 having holes formed a PF-20-X4 material applied to the exit surface 104. The laser parameters were the same as described with respect to FIGS. 13A and 13B. FIG. 14A shows that the resulting holes 140' have a circularity that is improved over the circularity of the holes 140 shown in FIG. 13A. Further, the walls entrance segments 141', the waist segments 142' and the exit segments 143' of the holes 140' (particularly the walls of the exit segment 143') are smooth, and do not possess the scalloped shape of the holes 140 depicted in FIG. 13B. This illustrates that the process window of laser energy over which smooth and non-microcracked holes are made is expanded by the use of an exit material. From FIG. 13A, the interior surface of the exit segment 143' appears to be just as smooth as that of the entrance segment 141'. Due to the mitigation of microcracks, some embodiments described herein result in an average surface roughness of interior surfaces of the hole from a waist of the hole to the entrance surface (i.e., entrance segment 141') and an average surface roughness of interior surfaces of the hole from the waist of the hole to the exit surface (i.e., exit segment 143') is less than 1 µm Ra.

Surface roughness may be measured by forming holes near an edge of a substrate. To measure surface roughness, a side-profile image is taken of the hole near the edge. An edge detection algorithm is performed on the image of the hole to determine the edges of the hole and the bulk of the substrate. The image processing program ImageJ converts an 8 bit image of the side profile of the hole into a binary figure using the "minimum method" within ImageJ. Subsequently, an edge detection algorithm is used where every row in the image is scanned until a transition from 0 to 255 in the intensity scale is detected (which corresponds to the edge of the hole). Using a least squares minimization fitting routine, the detected edge is fitted to a polynomial curve, typically a second degree polynomial of the kind: $y=ax^2+bx+c$, where y is the distance from the horizontal axis to the detected edge, x is the location on the horizontal axis corresponding to the depth in the substrate, and a, b and c are constants calculated during the fitting routine. Next, the intrinsic curvature is removed by subtracting the fitted polynomial curve from the detected edge data, and the residuals are calculated to yield a straightened roughness profile. Various statistical roughness parameters may be extracted from the straightened roughness profile, such as, without limitation, Ra, Rq, Rz, highest peak, lowest valley, top diameter, bottom diameter, and waist percentage. Additional information regarding calculating surface roughness Ra of interior walls of holes is provided in U.S. Patent Publication No. US 2018-0068868, which is incorporated by reference in its entirety.

To determine the improvement of hole quality over a large array of holes of a substrate having an exit material applied to the exit surface, three 400 µm thick EAGLE XG® glass substrates were processed to form 10,000 holes in each by the laser-damage-and-etch process described above. Particularly, 10,000 damage tracks were first formed using a quasi-non-diffracting beam having a focal line length of about 0.9 mm that was pulsed at 20 pulses per burst and provided 130 µJ of energy per burst. The wavelength of the laser was 532 nm, the pulse width was 7 psec, with 20 nsec between each pulse. One burst was applied per hole. A baseline glass substrate did not have any material applied to the exit surface. A second glass substrate had water disposed between the exit surface and an additional glass substrate. A third glass substrate had a photoresist polymer (D15133640 21x100 MX5015 CS1 3 sold by E. I. du Pont de Nemours and Company) applied to its exit surface.

The glass substrate was then chemically etched to form a plurality of holes that were opened from the damage tracks. The etchant was a 1.45M hydrofluoric and 1.58M nitric etchant solution. The holes had a diameter of approximately 80 µm. After etching, the holes were measured with a VHX-2000 microscope sold by Keyence Corp. of America of Itasca, Ill. to characterize the diameter and the circularity of the holes. As stated above, the circularity is the maximum diameter of the hole minus the minimum diameter of the hole measured at either the entrance surface or the exit surface. It is noted that because the microscope optics have a depth of field, and do not simply measure the hole diameter at exactly the entrance and exit surfaces of the glass substrates, the measurements may pick up irregularities in the depth of the glass, such as those that may be caused by an internal defect such as a bowed shape in the wall of a hole.

Histograms showing the statistics for the entrance surface diameter, the exit surface diameter, the entrance surface circularity and the exit surface circularity for the baseline glass substrate without an exit material are shown in FIGS. 15A-15D. Particularly, FIG. 15A graphically depicts a histogram of entrance surface diameters of the holes, FIG. 15B graphically depicts a histogram of exit surface diameters of the holes, FIG. 15C graphically depicts a histogram of entrance surface circularities of the holes, and FIG. 15D graphically depicts a histogram of exit surface circularities of the holes.

Figure 15A:
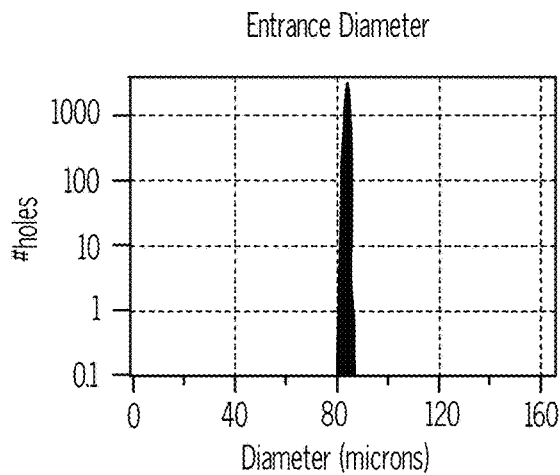
FIG. 15A graphically depicts a histogram of entrance surface diameters of holes etched in a substrate wherein no exit material was applied to an exit surface of the substrate during laser processing.
Figure 15B:
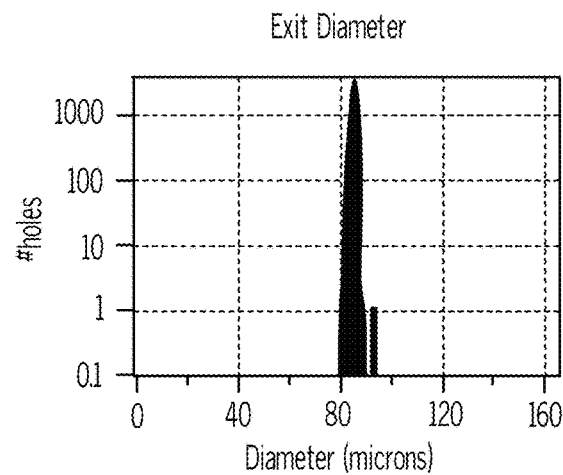
FIG. 15B graphically depicts a histogram of exit surface diameters of holes etched in the substrate of FIG. 15A.
Figure 15C:
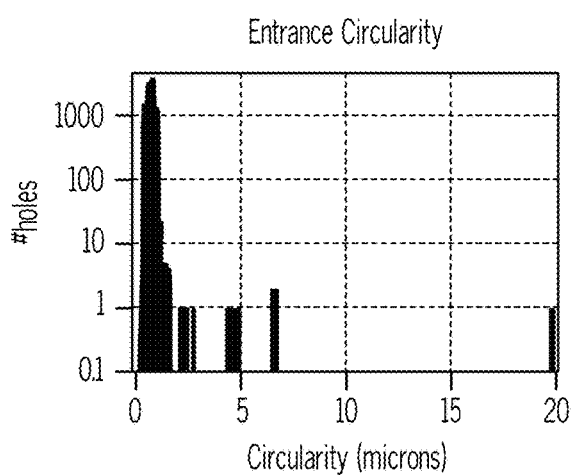
FIG. 15C graphically depicts a histogram of entrance surface circularities of holes etched in the substrate of FIG. 15A.

The diameter distributions of both the entrance surface and the exit surface are very similar, with averages close to 82-83 µm. However, the circularity histograms are different. The entrance surface circularities shown in FIG. 15C are lower, indicating rounder holes. However, the exit surface circularities shown in FIG. 15D shift distinctly away from zero, indicating that the holes are less round near or at the exit surface of the glass substrate. This is a signature of imperfections or roughness inside of the hole but only near the exit surface.

FIGS. 16A-16D depict the same measurements as FIGS. 15A-15D for the glass substrate having a photoresist polymer applied to the exit surface. Particularly, FIG. 16A graphically depicts a histogram of entrance surface diameters of the holes, FIG. 16B graphically depicts a histogram of exit surface diameters of the holes, FIG. 16C graphically depicts a histogram of entrance surface circularities of the holes, and FIG. 16D graphically depicts a histogram of exit surface circularities of the holes.

Figure 15D:
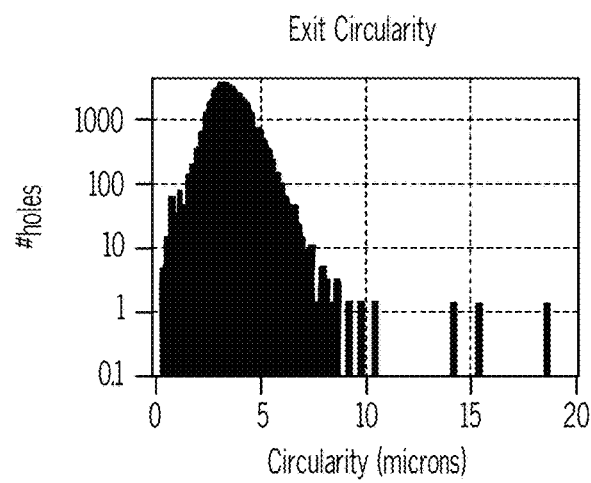
FIG. 15D graphically depicts a histogram of exit surface circularities of holes etched in the substrate of FIG. 15A.
Figure 16A:
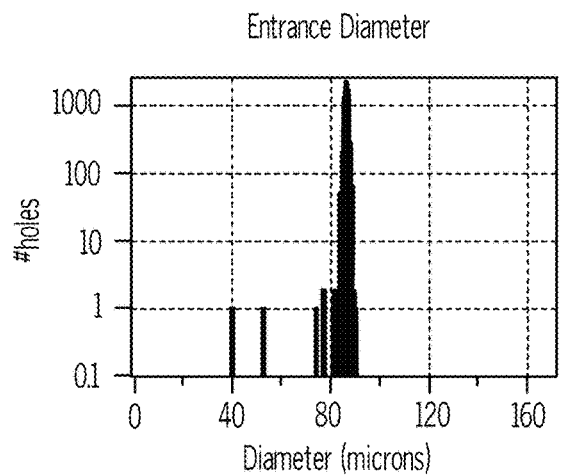
FIG. 16A graphically depicts a histogram of entrance surface diameters of holes etched in a substrate wherein a photoresist polymer was applied to an exit surface of the substrate during laser processing according to one or more embodiments described and illustrated herein.
Figure 16B:
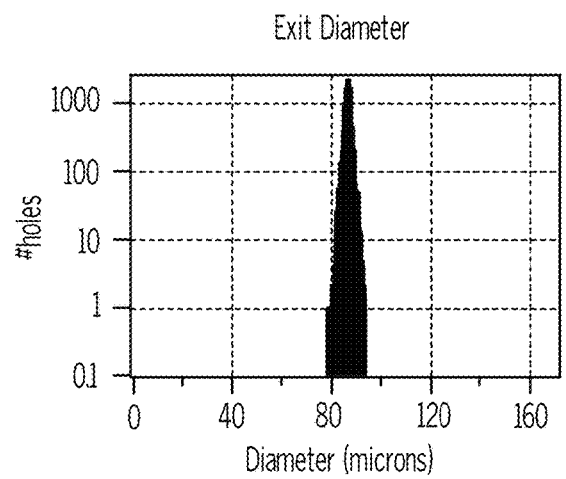
FIG. 16B graphically depicts a histogram of exit surface diameters of holes etched in the substrate of FIG. 16A.
Figure 16C:
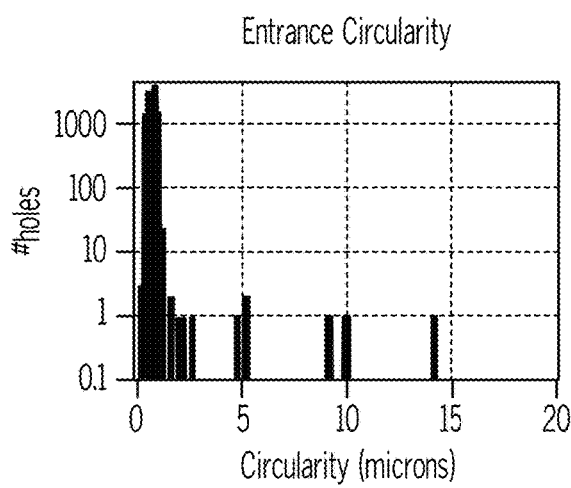
FIG. 16C graphically depicts a histogram of entrance surface circularities of holes etched in the substrate of FIG. 16A.
Figure 16D:
FIG. 16D graphically depicts a histogram of exit surface circularities of holes etched in the substrate of FIG. 16A.

The exit surface circularity histogram shown by FIG. 16D is distinctly different from FIG. 15D, thereby showing more holes with near-zero circularity. However, a fraction of holes have a higher circularity (i.e., less round) as indicated by the tail of the distribution. The holes with higher circularity may be the result of the photoresist polymer not being consistent or spatially uniform, thereby causing some locations to be improved and other not leading to the bi-modal histogram.

FIGS. 17A-17D depict the same measurements as FIGS. 15A-15D for the part having water applied to the exit surface. Particularly, FIG. 17A graphically depicts a histogram of entrance surface diameters of the holes, FIG. 17B graphically depicts a histogram of exit surface diameters of the holes, FIG. 17C graphically depicts a histogram of entrance surface circularities of the holes, and FIG. 17D graphically depicts a histogram of exit surface circularities of the holes.

Figure 17A:
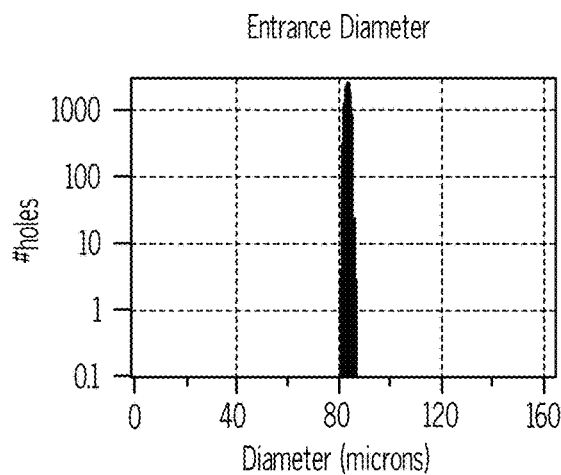
FIG. 17A graphically depicts a histogram of entrance surface diameters of holes etched in a substrate wherein a water layer and a glass layer was applied to an exit surface of the substrate during laser processing according to one or more embodiments described and illustrated herein.
Figure 17B:
FIG. 17B graphically depicts a histogram of exit surface diameters of holes etched in the substrate of FIG. 17A.
Figure 17C:
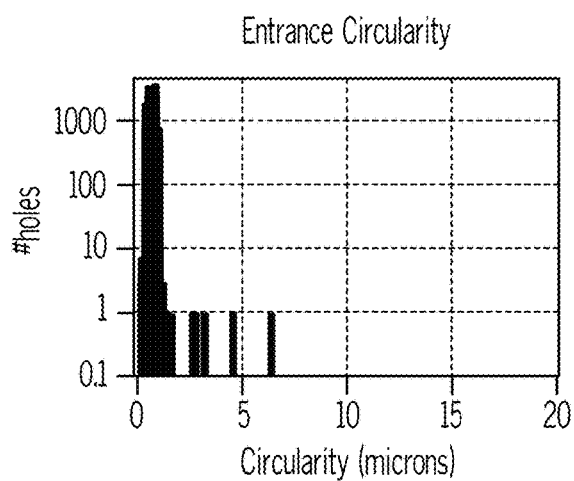
FIG. 17C graphically depicts a histogram of entrance surface circularities of holes etched in the substrate of FIG. 17A.
Figure 17D:
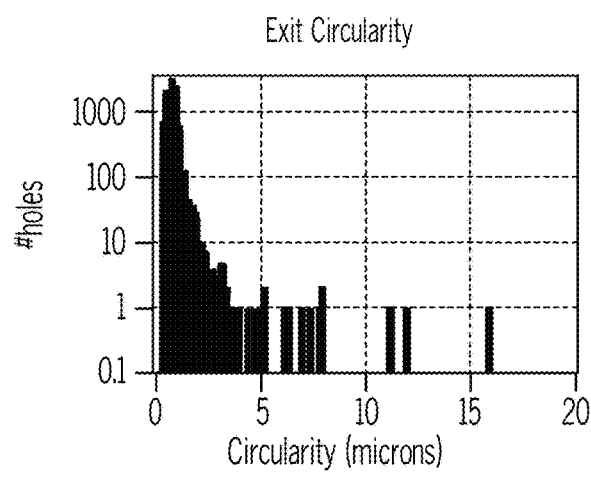
FIG. 17D graphically depicts a histogram of exit surface circularities of holes etched in the substrate of FIG. 17A.

In this case, the exit surface circularity histogram shown by FIG. 17D is demonstrably improved over the exit surface circularity histogram shown by FIG. 15D. The single peak of the histogram of FIG. 17D is very close to zero, indicating that the holes are much smoother and rounder than those of the baseline glass sample.

Figure 18:
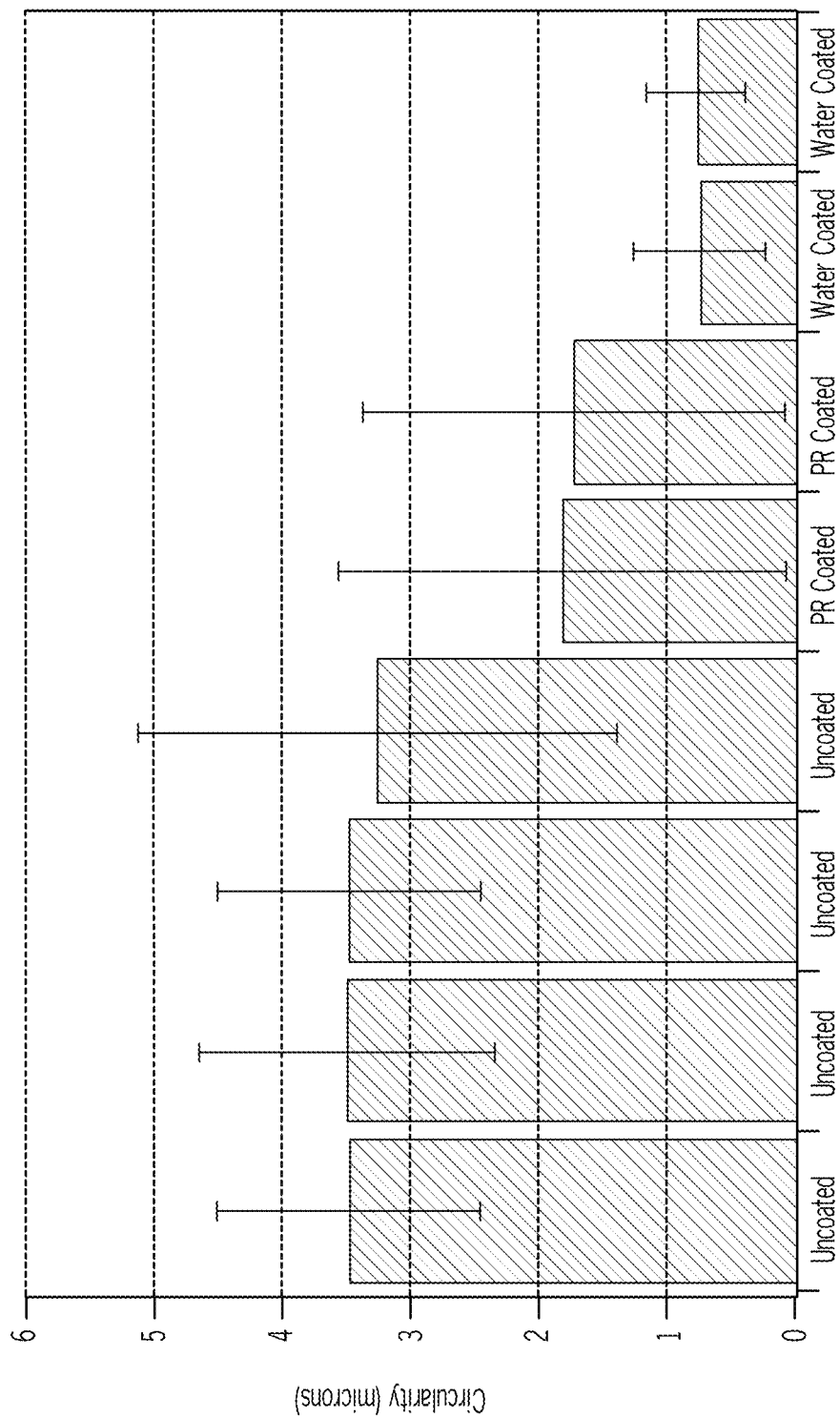
FIG. 18 graphically depicts average entrance diameters, entrance circularities, exit diameters, and exit circularities for glass substrate laser processed without an exit material, with a photoresist polymer, and with water.

FIG. 18 graphically shows a comparison of 10,000 exit surface circularity averages for three baseline glass samples, two glass samples having the photoresist polymer applied, and two glass samples having water applied. Holes were fabricated as described above with respect to the glass substrate illustrated by FIGS. 15A-15D, 16A-16D and 17A-17D. FIG. 18 illustrates that while both exit materials work to improve the quality of the holes, the water yields more consistent results than the photoresist polymer material. This may suggest that the photoresist polymer material is not attached to the exit surface uniformly at all locations where the holes were fabricated.

Accordingly, material having a refractive index close to that of the substrate may be applied to the exit surface of the substrate to reduce Fresnel reflections of the quasi-non-diffracting beam and thus reduce the formation of microcracks and/or voids along the damage track proximate the exit surface. Minimizing the formation of microcracks and/or voids create high quality holes having low circularity and smooth interior walls having a roughness of less than 2 µm Ra.

In some embodiments, there are other ways to minimize the impact of Fresnel side reflections in addition to, or in lieu of, applying an exit material to the exit surface. For example, the optical system 120 may be optimized to form a quasi-non-diffracting beam 122C that produces a shorted focal line 126 such that very little or none of the focal line 126 extends below the exit surface 104 of the substrate 100 (see FIG. 3). This may be achieved by using optics that create sharp cut-offs in the beam intensity along the optical axis, such as shown by the waxicon example of FIG. 4B. Alternatively, the cut-off may be accomplished by positioning a hard aperture such as an iris in the beam path in front of the axicon 123 as shown in FIG. 3. By vignetting the outermost rays in the input pulsed laser beam 122, the tail (i.e., end) of the focal line 126 will be cut off, creating a sharp cut-off at the tail of the focal line 126.

Regardless of the method used to generate the sharp cut-off in the tail of the focal line 126, if the tail of the focal line is made to extend just barely beyond the bottom of the substrate (e.g., 100 µm or less, 50 µm or less, 10 µm or less, 5 µm or less, or 1 µm or less), then very little energy can be reflected back into the substrate 100 to cause the intensity enhancement and resulting microcracks. In some embodiments, precise focus control of the focal line 126 should be made with respect to the substrate 100. Focus stage compensation schemes may be employed with minimal impact on process time.

Another way to minimize back reflections with coherency is to use shorter pulse width laser beams. Particularly, the pulse widths of the laser pulses may be such that the coherence time of the pulses is much less than the thickness of the substrate 100. As a non-limiting example, when the pulse width is about 10 psec, the coherence length is on the order of millimeters. This means that the back reflections coherently (either constructively or destructively) interfere with the original focal line 126, creating strong interference effects. However, if femtosecond pulse lasers are used, the coherence time and length may be greatly reduced, and the coherent interaction may be reduced or eliminated. The back reflection may still occur, but the magnitude of interference effects that could create the microcracks may be reduced.

It should now be understood that embodiments described herein provide methods of fabricating holes in a substrate by a laser-damage-and-etch process wherein the holes have a relatively low circularity and relatively smooth interior wall surfaces. Holes with such characteristics are desirable for downstream processes, such as metallization processes to fabricate interposers or redistribution layers. Particularly, the methods described herein employ quasi-non-diffracting beams to produce damage tracks that are then chemically etched to open holes at the damage tracks. Microcracks along the damage tracks proximate an exit surface of the substrate that result in high circularity and rough interior surfaces are mitigated by reducing the effects of Fresnel reflections of the quasi-non-diffracting beam back into the substrate. In some embodiments, an exit material having a refractive index similar to the substrate is applied to the exit surface of the substrate to minimize Fresnel reflections of the quasi-non-diffracting beam back into the substrate. In some embodiments, the laser focal line of the quasi-non-diffracting beam is focused into the substrate or otherwise prepared such that it does not significantly extend below the exit surface of the substrate. In some embodiments, the pulse width of the pulsed laser beam is short (e.g., within the femtosecond range) to minimize coherent back reflections of the quasi-non-diffracting beam back into the substrate.

Thus, embodiments described herein eliminate or significantly reduce the small microcracks present near the exit surface of the substrate without reducing the pulse energy of the laser beam. By allowing higher laser pulse energies to be used without creating microcracks, the exit material applied to the exit surface of the substrate enables stronger damage tracks to be formed, and hence holes with more open (i.e., wider) waists post-etch. Further, the embodiments described herein lead to larger process tolerances for laser burst (or pulse) energy during the laser damage step. By reducing or eliminating the exit surface back reflections, high laser energies may be used without causing microcrack formation. Therefore the processes described herein may be more stable as small changes in laser energy no longer have a significant impact on damage track formation, thereby increasing yield.

It will be apparent to those skilled in the art that various modifications and variations can be made to the embodiments described herein without departing from the spirit and scope of the claimed subject matter. Thus it is intended that the specification cover the modifications and variations of the embodiments described herein provided such modification and variations come within the scope of the appended claims and their equivalents.

The invention claimed is:

1. A method of processing a substrate comprising a first surface and a second surface, the method comprising:
    applying an exit material to the second surface of the substrate, wherein a difference between a refractive index of the exit material and a refractive index of the substrate is 0.4 or less; and
    focusing a pulsed laser beam into a quasi-non-diffracting beam directed into the substrate such that the quasi-non-diffracting beam enters the substrate through the first surface, the quasi-non-diffracting beam generating an induced absorption within the substrate, the induced absorption producing a damage track within the substrate,
    wherein:
        the substrate is transparent to at least one wavelength of the pulsed laser beam, and
        a location that the quasi-non-diffracting beam exits the exit material is 50 µm or more away from the second surface of the substrate in a direction parallel to the quasi-non-diffracting beam.

2. The method of claim 1, wherein the difference is 0.2 or less.

3. The method of claim 1, wherein the substrate is selected from the group consisting of glass, glass-ceramic and ceramic.

4. The method of claim 1, wherein a location that the quasi-non-diffracting beam exits the exit material is 50 µm or more away from the second surface of the substrate in a direction parallel to the quasi-non-diffracting beam.

5. The method of claim 1, wherein the exit material comprises at least two layers.

6. The method of claim 1, wherein the exit material is one or more of a polymer, an anti-reflective coating, a silicone layer, a photoresist layer, and water.

7. The method of claim 1, wherein the exit material comprises water and a supporting substrate such that the water is disposed between the supporting substrate and the second surface of the substrate.

8. The method of claim 1, wherein:
the exit material is a silicone layer and a polyester substrate; and
the silicone layer is disposed between the polyester substrate and the second surface of the substrate.

9. The method of claim 1, wherein the quasi-non-diffracting beam is selected from the group consisting of a Gauss-Bessel beam and an Airy beam.

10. The method of claim 1, wherein:
the quasi-non-diffracting beam comprises a beam waist; and
the quasi-non-diffracting beam defines a laser beam focal line having a first end point and a second end point;
the first end point and the second end point are defined as locations where the quasi-non-diffracting beam has propagated a distance from the beam waist equal to a Rayleigh range of the quasi-non-diffracting beam.

11. The method of claim 1, wherein the exit material is applied to the second surface such that there is a reflection of 2.5% or less at a predetermined region surrounding the damage track.

12. The method of claim 11, wherein a diameter of the predetermined region is 300 µm.

13. The method of claim 1, wherein the pulsed laser beam comprises a burst comprising a plurality of pulses.

14. The method of claim 13, wherein a pulse width of each pulse of the plurality of pulses is within a range of 100 fsec to 10 psec, including endpoints.

15. The method of claim 1, wherein:
the quasi-non-diffracting beam defines a laser beam focal line having a first endpoint and a second endpoint each defined by locations where the quasi-non-diffracting beam has propagated a distance from the beam waist equal to a Rayleigh range;
the first endpoint is closer to the first surface of the substrate than the second surface;
the second endpoint is closer to the second surface of the substrate than the first surface; and
the second endpoint is outside of the substrate such that a distance between the second endpoint and the second surface is 100 µm or less.

16. The method of claim 15, wherein the second endpoint is outside of the substrate such that a distance between the second endpoint and the second surface is 10 µm or less.

17. The method of claim 1, further comprising etching the substrate in an etching solution to produce a hole having a diameter of 1 µm or more by enlarging the damage track in the substrate.

18. The method of claim 17, further comprising coating interior surfaces of the hole with an electrically conductive material to provide electrical conductivity between a top and a bottom of the hole.

19. The method of claim 17, wherein a difference between an average surface roughness of interior surfaces of the hole from a waist of the hole to the first surface and an average surface roughness of interior surfaces of the hole from the waist of the hole to the second surface is 1 µm Ra or less.

20. A method of forming a hole in a substrate comprising a first surface and a second surface, the method comprising:
focusing a pulsed laser beam into a quasi-non-diffracting beam directed into the substrate such that the quasi-non-diffracting beam enters the substrate through the first surface, the quasi-non-diffracting beam generating an induced absorption within the substrate, the induced absorption producing a damage track within the substrate, wherein:
the substrate is transparent to at least one wavelength of the pulsed laser beam;
the quasi-non-diffracting beam defines a laser beam focal line having a first endpoint and a second endpoint each defined by locations where the quasi-non-diffracting beam has propagated a distance from a beam waist equal to a Rayleigh range;
the first endpoint is closer to the first surface of the substrate than the second surface;
the second endpoint is closer to the second surface of the substrate than the first surface; and
the second endpoint is outside of the substrate such that a distance between the second endpoint and the second surface is 100 µm or less; and
etching the substrate to produce the hole by enlarging the damage track in the substrate.

21. A method of processing a substrate comprising a first surface and a second surface, the method comprising:
disposing a liquid between a first surface of a supporting substrate and the second surface of the substrate, wherein a difference between a refractive index of the supporting substrate and a refractive index of substrate is 0.4 or less, and a difference between a refractive index of the liquid and the refractive index of the substrate is 0.4 or less;
focusing a pulsed laser beam into a quasi-non-diffracting beam directed into the substrate such that the quasi-non-diffracting beam enters the substrate through the first surface, the quasi-non-diffracting beam generating an induced absorption within the substrate, the induced absorption producing a damage track within the substrate; and
etching the substrate in an etching solution to produce a hole having a diameter of 1 µm or more by enlarging the damage track in the substrate;
wherein the substrate and the supporting substrate are transparent to at least one wavelength of the pulsed laser beam.

22. The method of claim 21, wherein a difference between an average surface roughness of interior surfaces of the hole form a waist of the hole to the first surface and an average surface roughness of interior surfaces of the hole from the waist of the hole to the second surface is 1 µm Ra or less.

* * * * *

UNITED STATES PATENT AND TRADEMARK OFFICE
CERTIFICATE OF CORRECTION

| | |
|---|---|
| PATENT NO. | : 11,344,973 B2 |
| APPLICATION NO. | : 16/377947 |
| DATED | : May 31, 2022 |
| INVENTOR(S) | : Bertrand Paris et al. |

It is certified that error appears in the above-identified patent and that said Letters Patent is hereby corrected as shown below:

On the Title Page

On page 2, Item (56), in Column 2, under "Other Publications", Line 7, delete "Merrrian" and insert -- Merriam --.

On page 2, Item (56), in Column 2, under "Other Publications", Line 7, delete "defintion" and insert -- definition --.

Signed and Sealed this
Eleventh Day of October, 2022

Katherine Kelly Vidal
*Director of the United States Patent and Trademark Office*